United States Patent
Nomura et al.

[11] Patent Number: 5,809,361
[45] Date of Patent: Sep. 15, 1998

[54] FLEXIBLE PRINTED CIRCUIT BOARD

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 781,604

[22] Filed: Jan. 9, 1997

[30] Foreign Application Priority Data

Jan. 26, 1996 [JP] Japan .................................. 8-012317
Feb. 19, 1996 [JP] Japan .................................. 8-031078

[51] Int. Cl.⁶ .............................. G03B 7/00; G03B 17/00
[52] U.S. Cl. ........................ 396/542; 396/72; 174/250; 361/749
[58] Field of Search ............................. 396/72, 89, 529, 396/542, 535; 361/749; 174/250, 254, 117 F, 117 FF; 359/817, 819, 676, 811

[56] References Cited

U.S. PATENT DOCUMENTS

| | | | |
|---|---|---|---|
| 4,864,348 | 9/1989 | Fujiwara et al. | 396/542 |
| 5,005,105 | 4/1991 | Onodera. | |
| 5,051,764 | 9/1991 | Nomura. | |
| 5,079,577 | 1/1992 | Nomura. | |
| 5,231,449 | 7/1993 | Nomura | 396/542 |
| 5,267,088 | 11/1993 | Nomura. | |
| 5,371,569 | 12/1994 | Tanaka. | |
| 5,398,163 | 3/1995 | Sano. | |
| 5,572,374 | 11/1996 | Okada et al. | 361/749 |
| 5,655,171 | 8/1997 | Machida et al. | 396/535 |

OTHER PUBLICATIONS

A United Kingdom Search Report, dated Apr. 3, 1997 with UK Application No. 9701464.1.

*Primary Examiner*—A. A. Mathews
*Attorney, Agent, or Firm*—Greenblum & Bernstein, P.L.C.

[57] ABSTRACT

A flexible printed circuit board is disclosed having a predetermined circuit pattern printed thereon. The flexible printed circuit board is bent at a predetermined location. The flexible printed circuit board includes a covered portion at which a part of the printed circuit pattern is covered by a covering layer, and an uncovered portion at which another part of the printed circuit pattern is not covered by the covering layer. The covered and uncovered portions are formed on the flexible printed circuit board. A border of the covering layer that is located adjacent to the uncovered portion on the flexible printed circuit board is positioned in the vicinity of the bent portion and is formed to be longer than a possible minimum length of the border.

10 Claims, 26 Drawing Sheets

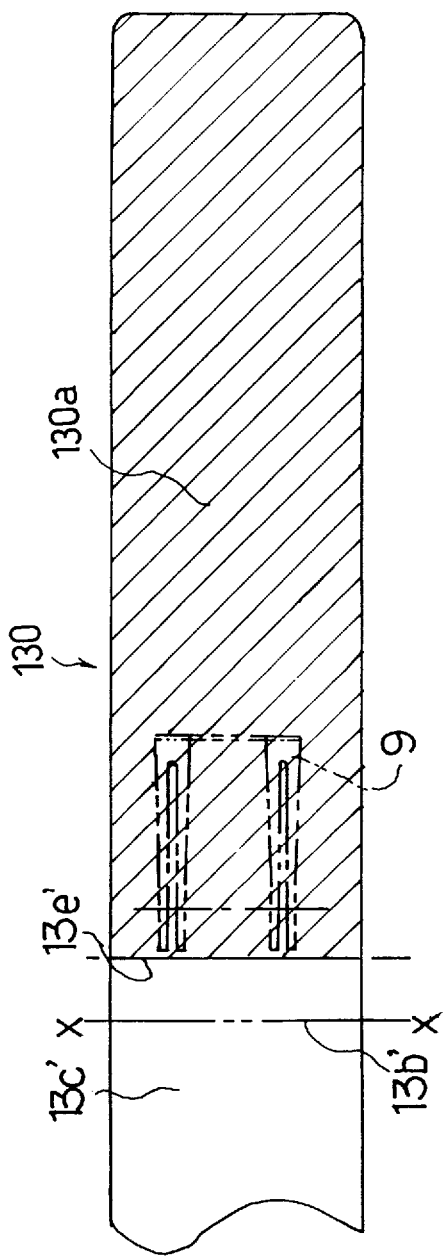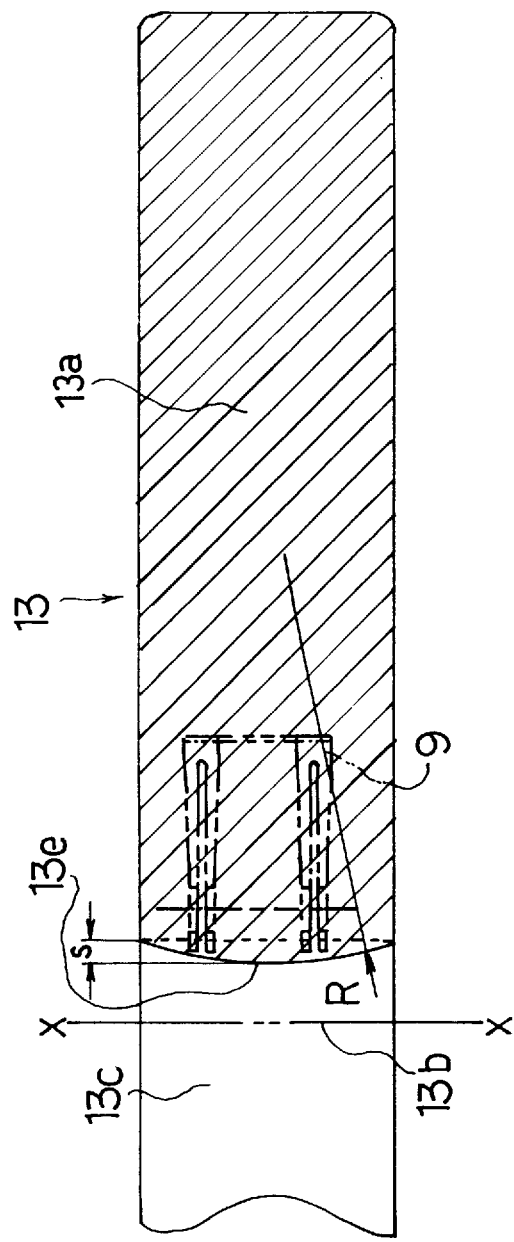
Fig.21. PRIOR ART
Fig.22

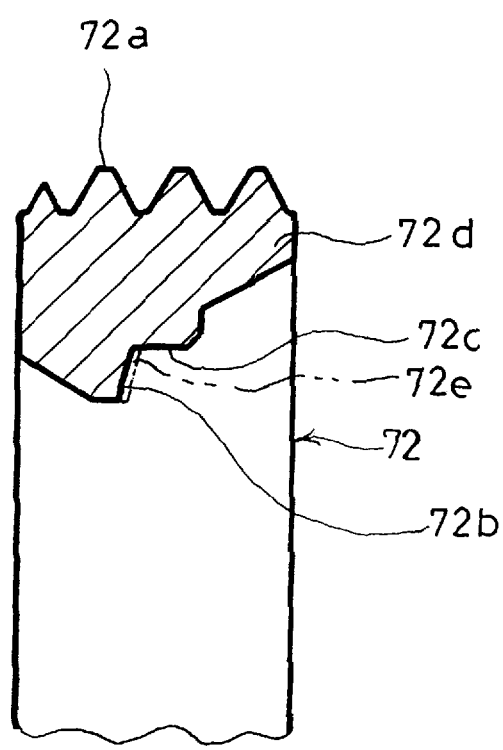

FLEXIBLE PRINTED CIRCUIT BOARD

BACKGROUND OF THE INVENTION

1. Field of the Invention

The present invention relates to a flexible printed circuit board which can be used in a camera. In particular, the present invention relates to a flexible printed circuit board which electrically connects an electrical device provided in a moving barrel of a photographic lens with another electrical device provided in a camera body.

2. Description of the Related Art

Flexible printed circuit boards are widely used in electrical instruments or appliances to electrically connect electrical devices which move relatively to each other. For example, in a lens shutter type of camera provided with a zoom lens having a moving barrel which advances from or retracts into a camera body to effect zooming, a long strip-shaped flexible printed circuit board is generally used to connect an electrical device provided in the moving barrel (e.g., an electrically-driven AF/AE shutter unit) with another electrical device provided in the camera body (e.g., a CPU). Such a flexible printed circuit board is usually provided with a covering layer (covering material) firmly attached to a surface of the flexible printed circuit board on which a circuit pattern is printed. The covering layer protects the printed circuit pattern from being scratched or damaged.

A part of the flexible printed circuit board is commonly used as a coding plate (code plate) which is provided with a predetermined coding pattern which is slidably contacted by an electric brush. Specified electric signals are generated depending on a contacting position of the electric brush relative to the coding pattern. In this type of flexible printed circuit board, the portion used as the coding plate is not covered by the covering layer so that the electric brush can contact the exposed coding pattern. Conventionally, in order to form such an exposed portion on the flexible printed circuit board on which the coding pattern is formed, a border or edge of the covering layer on the flexible printed circuit board is formed straight along a straight line perpendicular to a longitudinal direction of the strip-shaped flexible printed circuit board.

When a long strip-shaped flexible printed circuit board of such type is used to electrically connect two moving devices which are relatively moved by a large distance, the long strip-shaped flexible printed circuit board is generally positioned with at least a part of the flexible printed circuit board being bent. The number of portions of the flexible printed circuit board at which a bend is to be made depends upon the movable distance of the two moving devices and/or the shape of a space in which the flexible printed circuit board is positioned.

The inventors of the present invention have found that the following problem tends to occur with such a flexible printed circuit board. Namely, in the case that the aforementioned border or edge of the covering layer on the flexible printed circuit board is located in the vicinity of a bent portion of the flexible printed circuit board, a bending stress tends to concentrate at the border, resulting in the bent portion becoming damaged, which over a period of time causes a disconnection of the printed circuit pattern.

SUMMARY OF THE INVENTION

An object of the present invention is to provide a flexible printed circuit board having a code plate that is not easily damaged along a border of a covering layer formed on the flexible printed circuit board, in the case where a portion of the flexible printed circuit board at which the flexible printed circuit board is bent, is located in the vicinity of the border of the covering layer.

To achieve the object mentioned above, according to an aspect of the present invention, there is provided a flexible printed circuit board having a predetermined circuit pattern printed thereon, the flexible printed circuit board being bent at a predetermined portion, the flexible printed circuit board includes a covered portion at which a part of the printed circuit pattern is covered by a covering layer, and an uncovered portion at which another part of the printed circuit pattern is not covered by the covering layer. The covered and uncovered portions are formed on the flexible printed circuit board. A border of the covering layer that is located adjacent to the uncovered portion on the flexible printed circuit board is positioned in a vicinity of the bent portion and is formed to be longer than a possible minimum length of the border.

According to another aspect of the present invention, there is provided a strip-shaped flexible printed circuit board having a predetermined circuit pattern printed thereon, the flexible printed circuit board being bent at a bent portion, the strip-shaped flexible printed circuit board includes a covered portion at which a part of the printed circuit pattern is covered by a covering layer, and an uncovered portion at which another part of the printed circuit pattern is not covered by the covering layer to form the uncovered portion as a coding plate with which an electrical brush slidably contacts. The covered and uncovered portions are formed on the flexible printed circuit board wherein a border of the covering layer that is located adjacent to the uncovered portion on the flexible printed circuit board is formed as a curved border in a vicinity of the bent portion, with a center of the curved border being located closer to the bent portion than either edge of the curved border.

According to yet another aspect of the present invention, there is provided a strip-shaped flexible printed circuit board having a predetermined circuit pattern printed thereon, the flexible printed circuit board being bent at a bent portion, the strip-shaped flexible printed circuit board includes a covered portion at which a part of the printed circuit pattern is covered by a covering layer, and an uncovered portion at which another part of the printed circuit pattern is not covered by the covering layer to form the uncovered portion as a coding plate with which an electrical brush slidably contacts. The covered and uncovered portions are formed on the flexible printed circuit board. A border of the covering layer that is located adjacent to the uncovered portion on the flexible printed circuit board is formed non-parallel to the bent portion.

According to yet another aspect of the present invention, there is provided a flexible printed circuit board having a predetermined circuit pattern printed thereon, the flexible printed circuit board being bent at a bent portion, the flexible printed circuit board includes a covered portion at which a part of the printed circuit pattern is covered by a covering layer, and an uncovered portion at which another part of the printed circuit pattern is not covered by the covering layer. The covered and uncovered portions are formed on the flexible printed circuit board. A border of the covering layer that is located adjacent to the uncovered portion on the flexible printed circuit board is formed such that a bending stress occurring in a vicinity of the bent portion disperses in a longitudinal direction of the flexible printed circuit board.

The present disclosure relates to subject matter contained in Japanese Patent Application Nos. 8-12317, filed on Jan.

26, 1996, and 8-31078, filed on Feb. 19, 1996, which are expressly incorporated herein by reference in their entireties.

BRIEF DESCRIPTION OF THE DRAWINGS

The invention will be described below in detail with reference to the accompanying drawings in which similar elements are indicated by similar reference numerals, and wherein:

FIG. 21 is a schematic plan view of a conventional code plate formed integral with a flexible printed circuit board and having a conventional structure in which a border of a covering layer thereof is formed to be straight;

FIG. 22 is a schematic plan view of a code plate formed integral with a flexible printed circuit board provided in the zoom lens barrel;

FIG. 31 is an enlarged sectional view of a part of the lens fixing ring shown in FIG. 29.

DESCRIPTION OF THE PREFERRED EMBODIMENT

Figure 20:
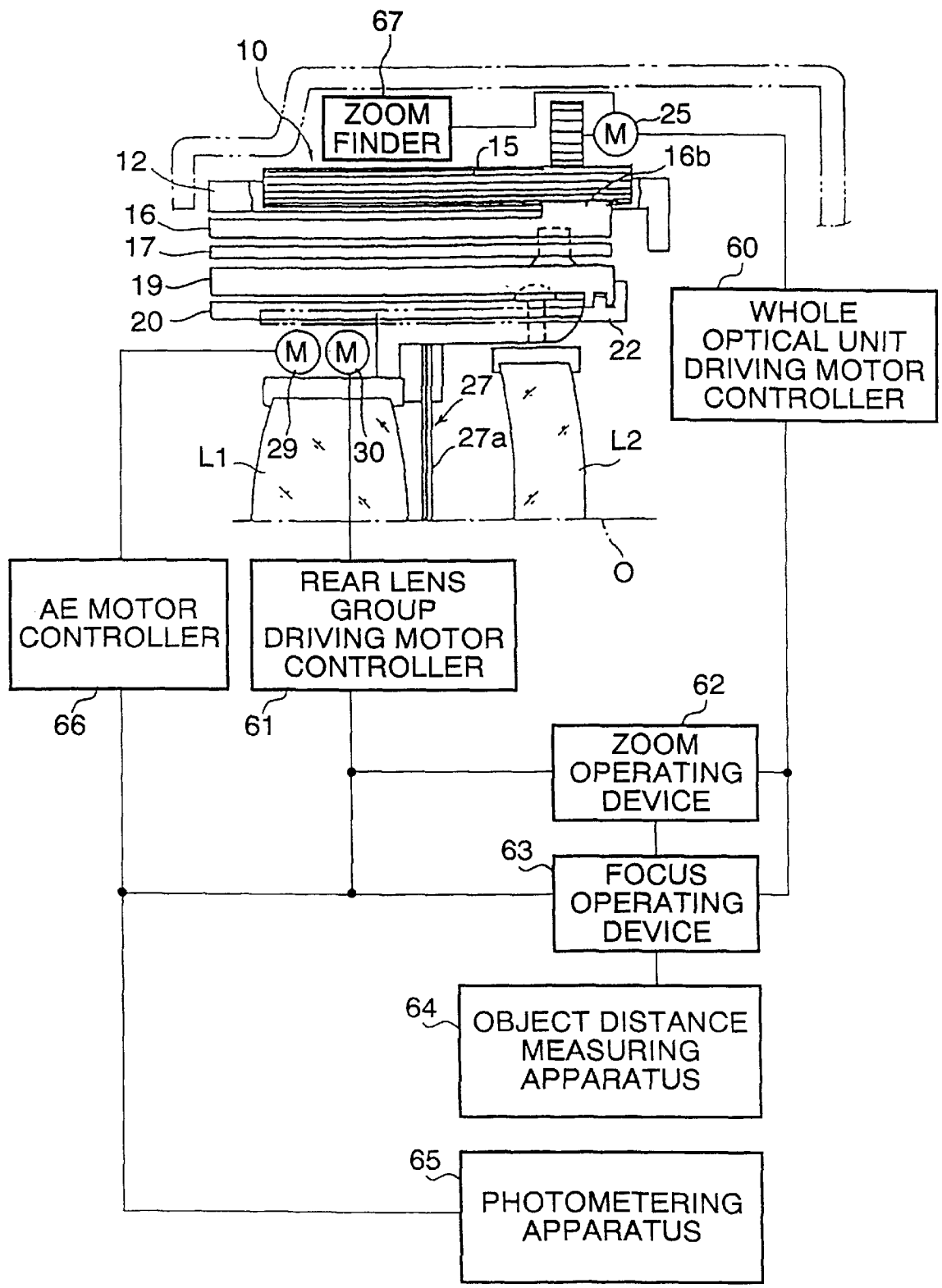
FIG. 20 is a block diagram of a controlling system for controlling an operation of the zoom lens barrel.

FIG. 20 is a schematic representation of various elements which comprise a preferred embodiment of a zoom lens camera to which the present invention is applied. A concept of the present zoom lens camera will now be described with reference to FIG. 20.

The zoom lens camera is provided with a zoom lens barrel (zoom lens) 10 of a three-stage delivery type (telescoping type) having three moving barrels, namely a first moving barrel 20, a second moving barrel 19 and a third moving barrel (rotational barrel) 16, which are concentrically arranged in this order from an optical axis O. In the zoom lens barrel 10, two lens groups are provided as a photographic optical system, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button (not shown) provided on the camera body. When the zoom operation device 62 is operated, the whole optical unit driving motor controller 60 drives a whole optical unit driving motor 25 to move the front lens group L1 and the rear lens group L2, rearwardly or forwardly without regard to a focal length and a focal point thereof. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies in accordance with the variation of the focal length through the operation of the zoom operating device 62. Therefore, the photographer can perceive the variation of the focal length by observing the variation of image magnification of the visual field of the finder. In addition, the focal length, as set by the operation of the zoom operating device 62, may be a value indicated by a value on an LCD (liquid crystal display) panel (not shown) or the like.

When the focus operating device 63 is operated, the whole optical unit driving motor controller 60 drives the whole optical unit driving motor 25. At the same time, the rear lens group driving motor controller 61 drives a rear lens group driving motor 30. The driving of the whole optical unit driving motor controller 60 and the rear lens group driving motor controller 61 causes the front and rear lens groups L1 and L2 to be moved to respective positions corresponding to a set focal length and a detected object distance, thereby the zoom lens is focused on the subject.

Specifically, the focus operating device 63 is provided with a release button (not shown) provided on an upper wall of the camera body. A photometering switch and a release switch (both not shown) are synchronized with the release button. When the release button is half-depressed (half step), the focus operating device 63 turns the photometering switch ON, and the object distance measuring and photometering commands are respectively input to the object distance measuring apparatus 64 and the photometering apparatus 65.

When the release button is fully depressed (full step), the focus operating device 63 turns the release switch ON, and according to the result of the object distance measurement and a set focal length, the whole optical unit driving motor 25 and the rear lens group driving motor 30 are driven, and the focusing operation is executed, in which the front lens group L1 and the rear lens group L2 move to the focusing position. Further, an AE motor 29 of an AF/AE (i.e., autofocus/autoexposure) shutter unit (electrical unit) 21 (FIG. 11) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operative device 62 is operated, the zoom operating device 62 drives the whole optical unit driving motor 25 to move the front and rear lens groups L1 and L2 together as a whole in the direction of the optical axis O (optical axis direction). The rear lens group driving motor 30 may also be driven via the rear lens group driving motor controller 61 to move the rear lens group L2 relative to the first lens group L1. However, this may not be performed under the conventional concept of zooming in which the focal length is varied sequentially without moving the position of the focal point.

When the zoom operating device 62 is operated, the following two modes are available:

1. A mode to move the front lens group L1 and the rear lens group L2 in the optical axis direction without varying the distance therebetween by driving only the whole optical unit driving motor 25; and 2. A mode to move the front lens group L1 and the rear lens group L2 in the optical axis direction while varying the distance therebetween by driving both the whole optical unit driving motor 25 and the rear lens group driving motor 30.

In mode 1, during a zooming operation an in-focus condition cannot be obtained at all times with respect to a subject located at a specific distance. However, in a lens-shutter type camera, since the image of the subject is not observed through the photographing optical system, but through the finder optical system provided separately from the photographing optical system, it is sufficient that the subject is only focused when the shutter is released. In mode 2, during a zooming operation the front lens group L1 and the rear lens group L2 are moved without regard to whether the focal point moves, and when the shutter is released, the focusing operation (focus adjusting operation) is carried out by moving both the whole optical unit driving motor 25 and the rear lens group driving motor 30.

When the focus operating device 63 is operated in at least one part of the focal length range set by the zoom operating device 62, the whole optical unit driving motor 25 and the rear lens group driving motor 30 are driven to bring the subject into focus. The amount of movement of each lens group L1 or L2 by the whole optical unit driving motor 25 and the rear lens group driving motor 30 is determined in accordance with subject distance information provided from the object distance measuring apparatus 64, and focal length information set by the zoom operating device 62. By moving both the whole optical unit driving motor 25 and the rear lens group driving motor 30 when the focus operating device 63 is operated, the position of the lens groups L1, L2 can be flexibly controlled in comparison to lens movements controlled by cam.

The zoom lens camera of this embodiment can also be controlled in a manner such that only the magnification of the zoom finder 67 and the focal length information are varied during an operation of the zoom operating device 62, without driving either the whole optical unit driving motor 25 or the rear lens group driving motor 30. Under this type of control, when the focus operating device 63 is operated, both the whole optical unit driving motor 25 and the rear lens group driving motor 30 are moved simultaneously according to the focal length information and the subject distance information obtained by the object distance measuring apparatus 64 to move the front lens group L1 and the rear lens group L2 to respective positions determined according to the focal length and the subject distance information.

An embodiment of the zoom lens barrel according to the above concept will now be described with reference to mainly FIGS. 2 and 19.

The overall structure of the zoom lens barrel 10 will firstly be described.

The zoom lens barrel 10 is provided with the first moving barrel 20, the second moving barrel 19, the third moving barrel 16, and a fixed lens barrel block 12. The third moving barrel 16 is engaged with a cylindrical portion 12p of the fixed lens barrel block 12, and moves in the optical axis direction upon being rotated. The third moving barrel 16 is provided on an inner periphery thereof with a linear guide barrel (cam ring or second barrel) 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole optical unit driving motor 25 is secured to the fixed lens barrel block 12. A shutter mounting stage 40 is secured to the first moving barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

Figure 2:
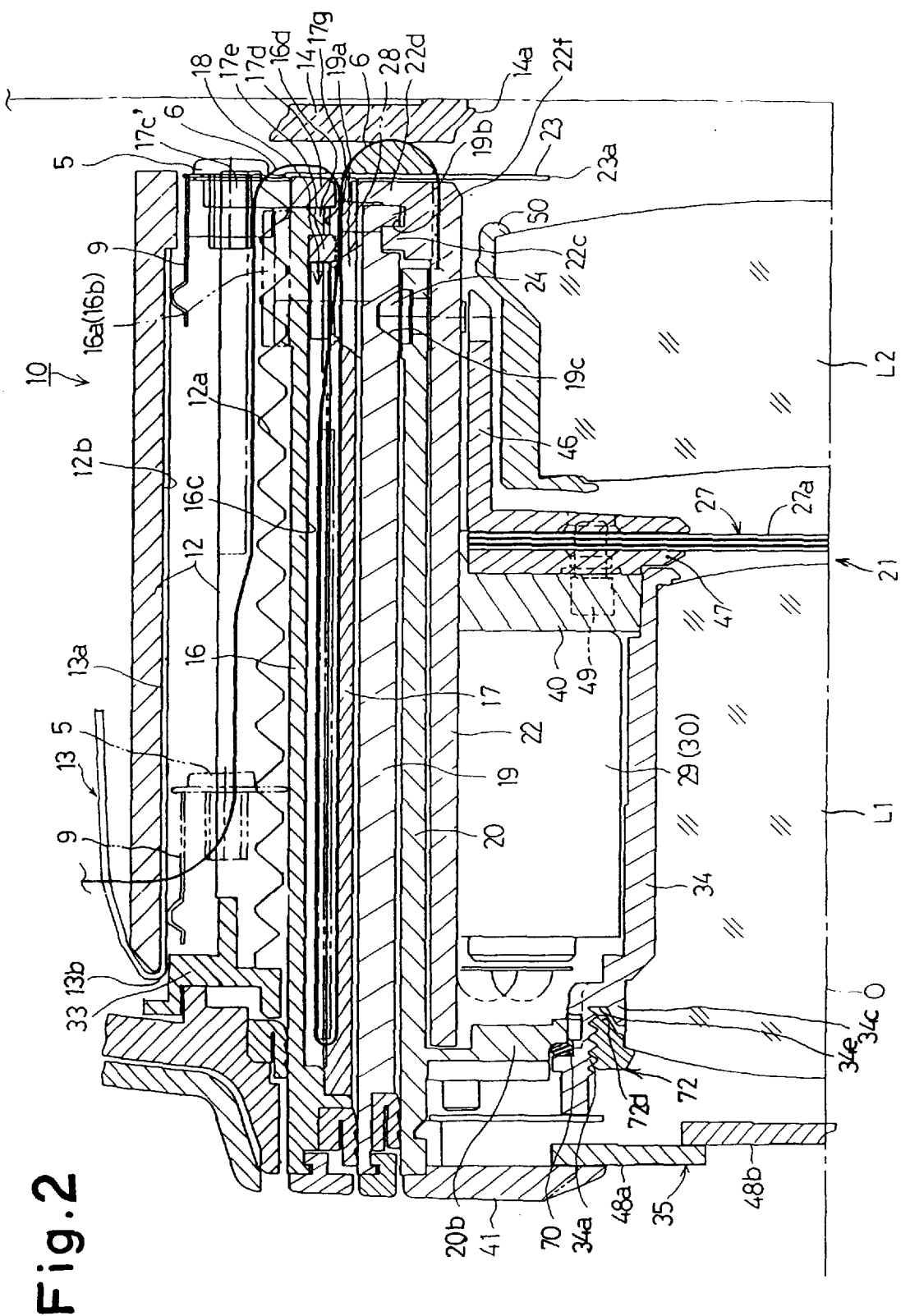
FIG. 2 is a sectional view of an upper part of the zoom lens barrel in a housed state.

An O-ring 70, made of a rubber or the like, is positioned between an outer peripheral circumferential surface of the front end of the lens supporting barrel 34, and an inner peripheral circumferential surface of an inner flange portion 20b integrally formed in the front end of the first moving barrel 20 as shown in FIG. 2. The O-ring 70 prevents water from penetrating the zoom lens barrel 10 at the front end thereof between the first moving barrel 20 and the lens supporting barrel 34.

Figure 29:
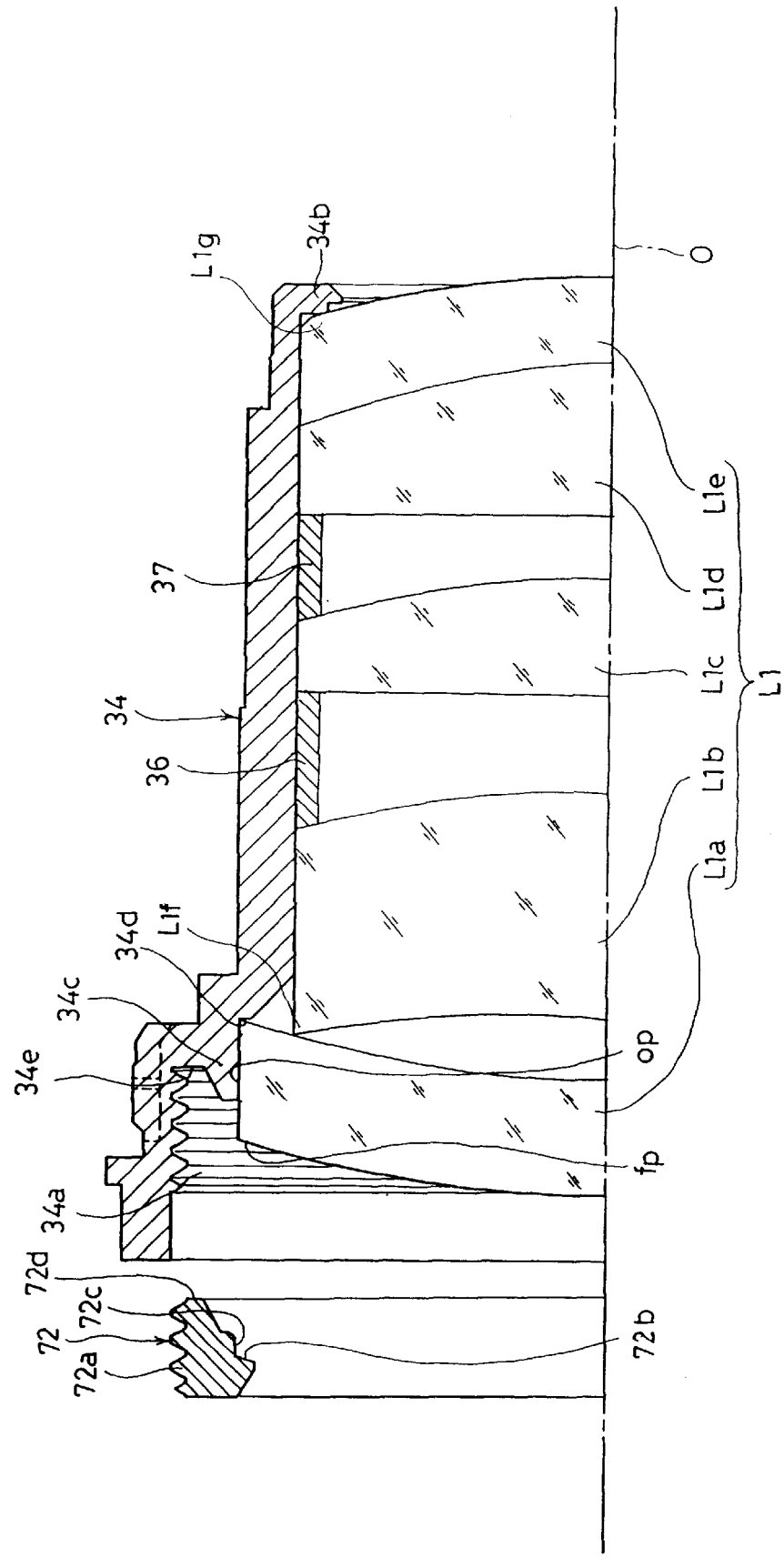
FIG. 29 is a sectional view of an upper part of a lens supporting barrel which supports a front lens group therein, and a lens fixing ring which is to be screw-engaged with the lens supporting barrel.

As shown in FIG. 29, the front lens group L1 consists of five lenses, namely a first lens (frontmost lens) L1a, a second lens L1b, a third lens L1c, a fourth lens L1d and a fifth lens L1e in this order from an object side to an image side, i.e., from the left hand side to the right hand side as viewed in FIG. 29.

A front positioning ring 36 for determining a distance between the second lens L1b and the third lens L1c is positioned and held between the second lens L1b and the third lens L1c. An outer peripheral surface of the positioning ring 36 is fitted on an inner peripheral surface of the lens supporting barrel 34. Likewise, a rear positioning ring 37 for determining a distance between the third lens L1c and the fourth lens L1d is positioned and held between the third lens L1c and the fourth lens L1d. An outer peripheral surface of the positioning ring 37 is fitted on an inner peripheral surface of the lens supporting barrel 34. The rear surface of the fourth lens L1d and the front surface of the fifth lens L1e are cemented to each other, so that the fourth and fifth lenses L1d, L1e are formed as a cemented or composite lens. A front circumferential edge L1f of the second lens L1b along the circumferential edge thereof contacts the rear surface of the first lens L1a. A rear circumferential edge L1g of the fifth lens L1e along the circumferential edge thereof contacts an inwardly-projecting flange 34b formed integral with the rear end of the lens supporting barrel 34.

Figure 30:
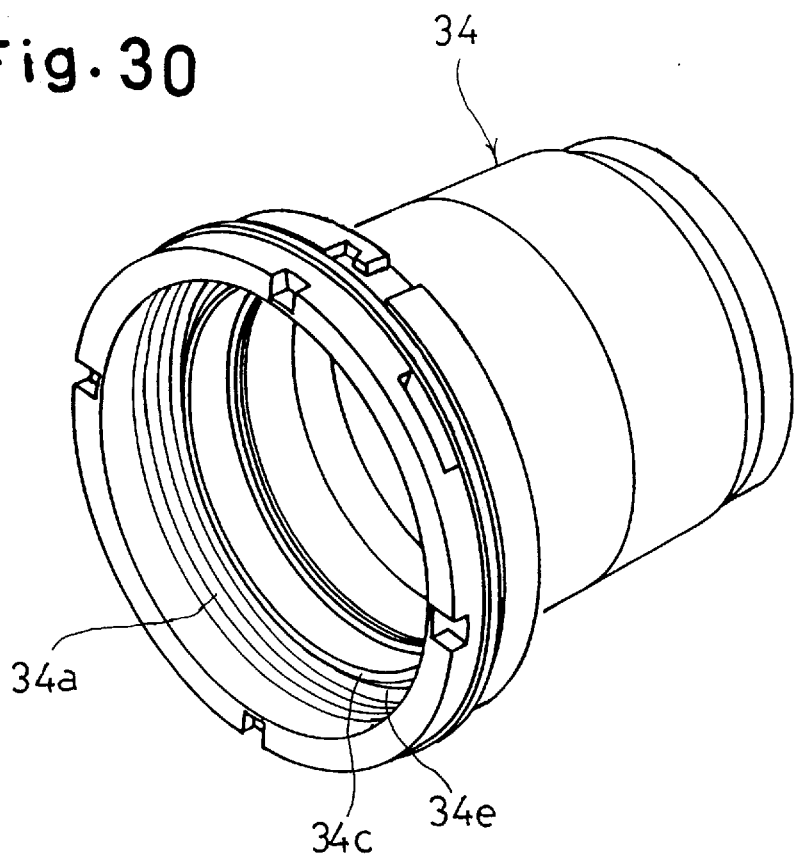
FIG. 30 is an enlarged perspective view of the lens supporting barrel shown in FIG. 29.

A female thread 34a is formed on an inner periphery of a front part of the lens supporting barrel 34, as shown in FIGS. 29 or 30. A lens fixing ring 72, for fixing the first lens L1a to the lens support barrel 34, engages with the lens supporting barrel 34. With this arrangement, a male thread 72a formed on the outer peripheral surface of the lens fixing ring 72 meshes with the female thread 34a. A circular abutting surface 72b is formed on the lens fixing ring 72 on an inner peripheral surface thereof. The circular abutting surface 72b comes into contact with a circumferential portion fp of the front surface of the first lens L1a in a state when the lens fixing ring 72 is properly screw-engaged with the lens supporting barrel 34. The circular abutting surface 72b is formed to be substantially parallel to the circumferential portion fp so that the circular abutting surface 72b and the circumferential portion fp may be brought tightly into contact with each other when the lens fixing ring 72 is properly screw-engaged with the lens supporting barrel 34.

A supporting ring portion 34c is formed integral with the lens supporting barrel 34. The supporting ring portion 34c is located inwardly from the female thread 34a in a radial direction of the lens supporting barrel 34. The inner peripheral surface of the supporting ring portion 34c, which extends in the optical axis direction, comes into contact with an outer circumferential edge or surface op of the first lens L1a. An annular positioning surface 34d, extending substantially normal to the optical axis O, is formed on the lens supporting barrel 34 immediately behind the supporting ring portion 34c. The circumferential edge of the rear surface of the first lens L1a comes into contact with the positioning surface 34d. With this structure, the first lens L1a is immovably held between the circular abutting surface 72b and the positioning surface 34d in the optical axis direction, and the first lens L1a is immovably held by the supporting ring portion 34c in a radial direction normal to the optical axis O.

As shown in FIG. 31, a coating 72e is coated on the circular abutting surface 72b. The coating 72e is a waterproof coating made of a synthetic resin. In the present embodiment, Fantas Coat SF-6 (trademark of a coating produced by the Japanese Company "Origin Denki Kabushiki Kaisha") is used as the coating 72e. The front surface of the first lens L1a is formed very smooth, whereas the circular abutting surface 72b of the lens fixing ring 72 is not formed as smoothly (i.e., has a rough finish) as the front surface of the first lens L1a. This is because the first lens L1a is more minutely and accurately formed than the lens fixing ring 72 since the first lens L1a is a precision optical element. Because of the differences in the finishes, in the absence of the coating 72e on the circular abutting surface 72b, a substantial gap would be formed between the circular abutting surface 72b and the circumferential portion fp. This would be the case even if the circular abutting surface 72b was properly and tightly in contact with the circumferential portion fp by properly screw-engaging the lens fixing ring 72 with the female thread 34a. As a result, water or moisture would be able to penetrate into the lens supporting barrel 34 through the substantial gap. However, in the present embodiment, the coating 72e is applied to the circular abutting surface 72b so as to make the surface thereof a smooth surface which eliminates the substantial gap between the circular abutting surface 72b and the circumferential portion fp when the circular abutting surface 72b properly contacts the circumferential portion fp. Accordingly, the coating 72e, positioned and held between the circular abutting surface 72b and the circumferential portion fp, effectively prevents water or moisture from penetrating the lens supporting barrel 34 between the circular abutting surface 72b and the circumferential portion fp when the circular abutting surface 72b is properly and tightly in contact with the circumferential portion fp by properly screw-engaging the lens fixing ring 72 with the female thread 34a.

A circular surface 72c is formed on the lens fixing ring 72. The circular surface 72c is connected to the circular abutting surface 72b and is located immediately outward in a radial direction from the circular abutting surface 72b. A front part of the outer circumferential surface op of the first lens L1a (i.e., a circumferential edge of the first lens L1a) comes into contact with the circular surface 72c when the lens fixing ring 72 properly engages with the female thread 34a. Due to the circular surface 72c contacting the outer circumferential surface op, the watertight structure between the circular abutting surface 72b and the circumferential portion fp, that is realized by the coating 72e, is enhanced. That is, a highly efficient watertight connection between the first lens L1a and the lens fixing ring 72 is realized by providing both the coating 72e and the circular surface 72c with the lens fixing ring 72.

An annular recessed portion 34e is formed on the lens supporting barrel 34 between the female thread 34a and the supporting ring portion 34c. As shown in FIG. 2, in a state where the lens fixing ring 72 is properly screw-engaged with the female thread 34a, a rear end 72d of the lens fixing ring 72 is positioned in the annular recessed portion 34e with the rear end 72d not contacting the bottom (i.e., rearmost end) of the recessed portion 34e. In particular, an annular space is formed in the annular recessed portion 34e between the rear end 72d and the bottom of the recessed portion 34e.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided on an inner periphery of the cylindrical portion 12p, with a female helicoid 12a, and also a plurality of linear guide grooves 12b each extending parallel to the optical axis O, i.e., extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 17:
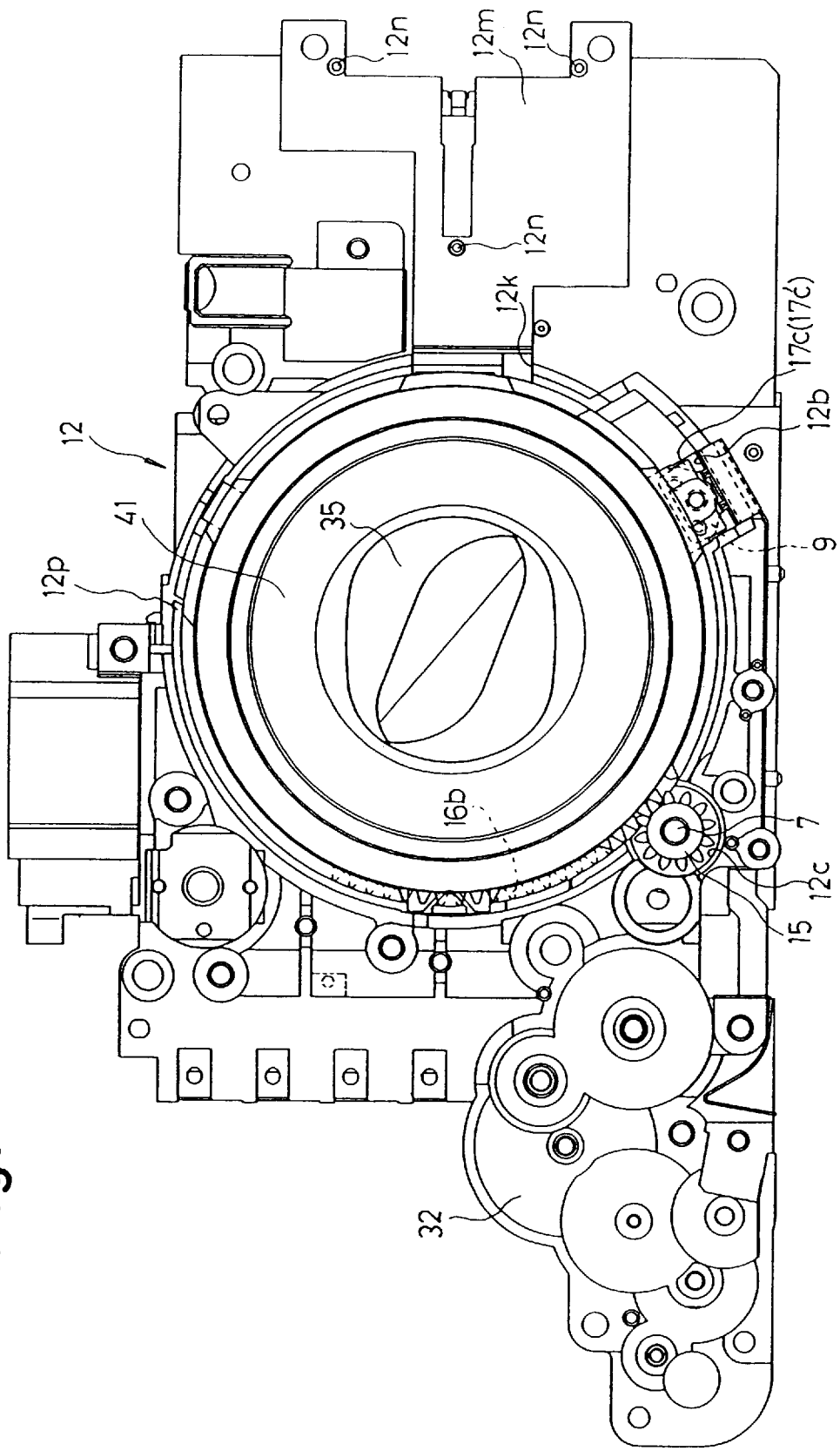
FIG. 17 is a front elevational view of the zoom lens barrel and the fixed lens barrel block shown in FIG. 16.
Figure 19:
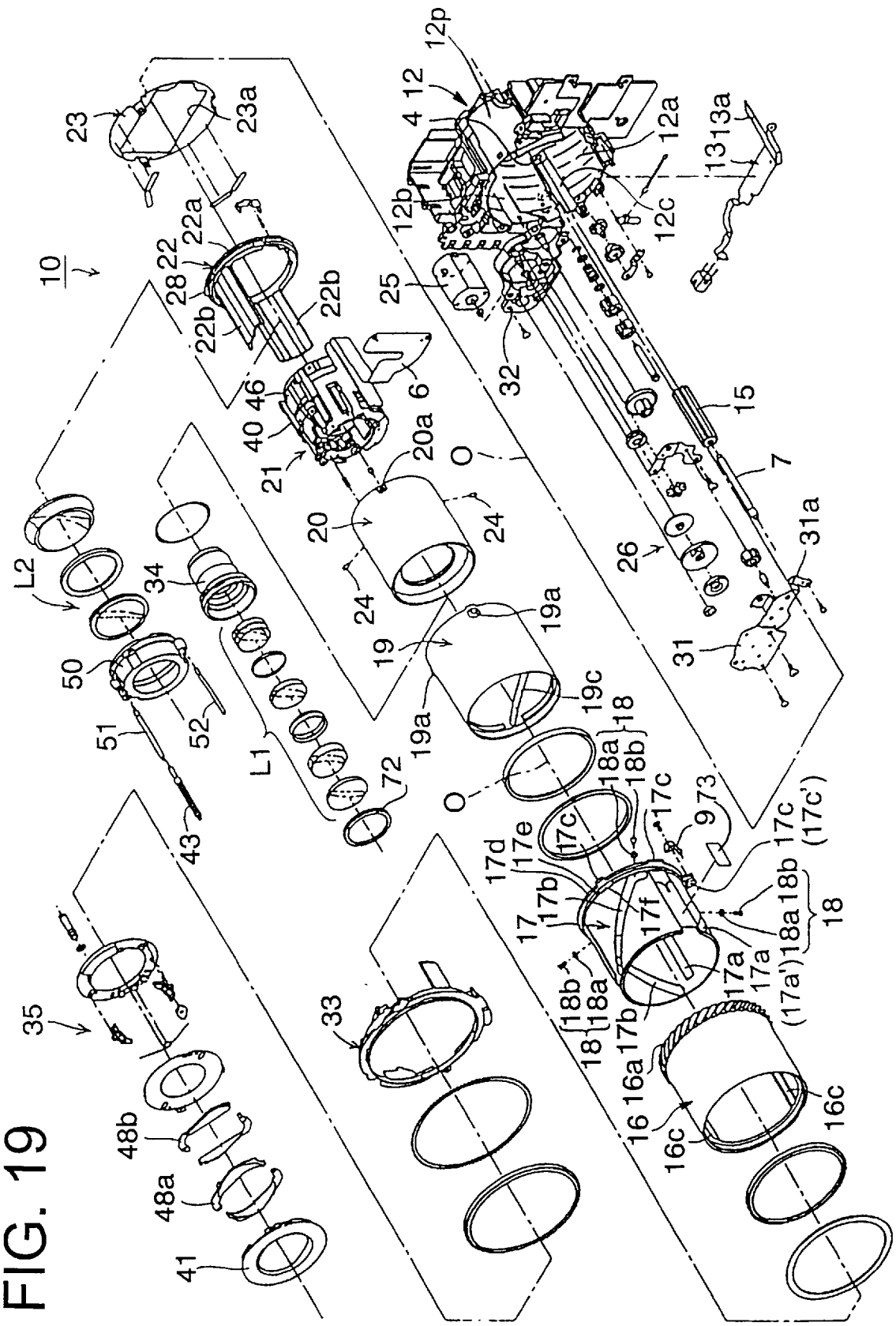
FIG. 19 is an exploded perspective view of the overall structure of the zoom lens barrel.

As shown in FIGS. 17 and 19, in the fixed lens barrel block 12, a gear housing 12c is provided which is recessed outwardly from an inner periphery of the cylindrical portion 12p of the fixed lens barrel block 12 in a radial direction while extending in the optical axis direction. In the gear housing 12c, a driving pinion 15 is rotatably held and extends in the optical axis direction. Both ends of an axial shaft 7 of the driving pinion 15 are rotatively supported by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion 12p of the fixed lens barrel block 12 so that the driving pinion 15 meshes with an outer peripheral gear 16b of the third moving barrel 16, as shown in FIG. 17.

Figure 11:
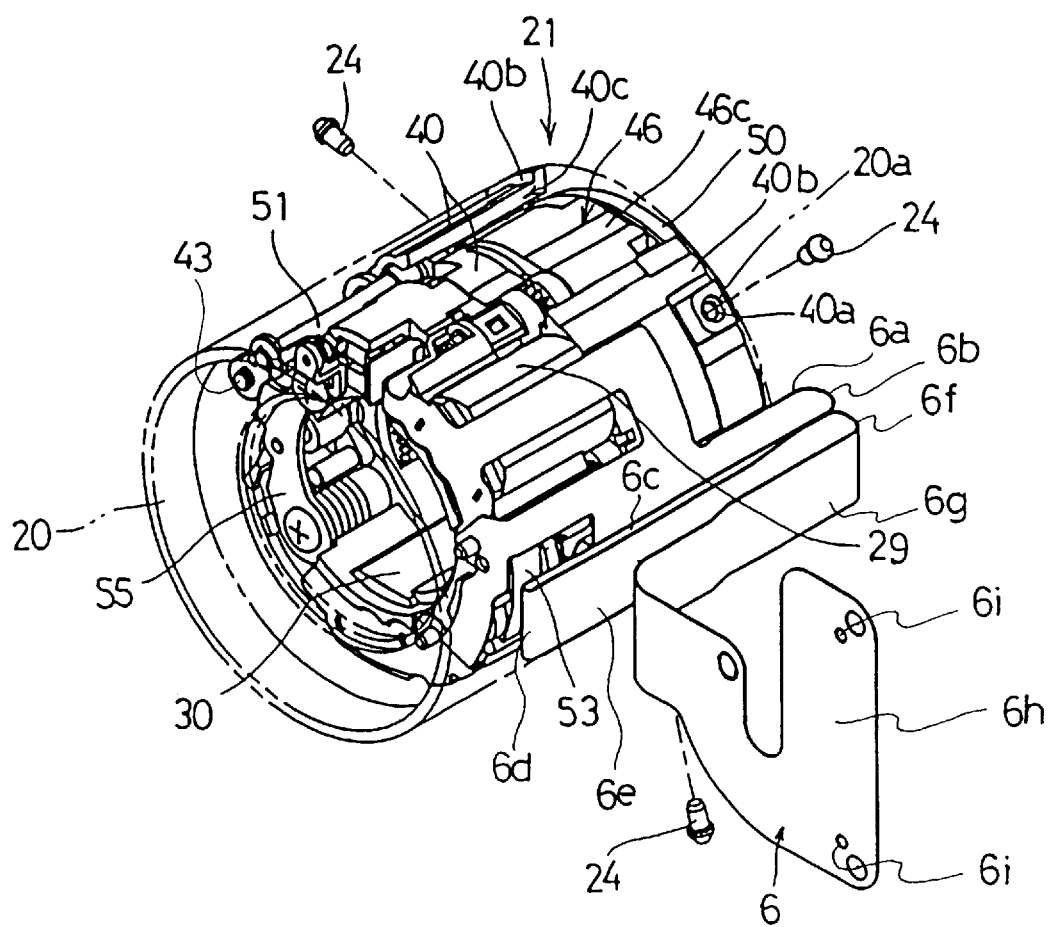
FIG. 11 is a schematic perspective view illustrating a state where the AF/AE shutter unit is mounted to the first moving barrel.

The fixed lens barrel block 12 is provided on one side with an integrally formed supporting member 32 as shown in FIG. 19. The whole optical unit driving motor 25 is secured to the rear of the supporting member 32. Thus, the whole optical unit driving motor 25 is not shown in FIG. 17. A gear train 26 consisting of a plurality of gears, is accommodated to be supported on a front of the supporting member 32. The fixed lens barrel block 12 is further provided on the other side thereof (opposite to the side having the supporting member 32) with a stationary plate 12m integrally formed therewith. A plurality of projections 12n are integrally formed on the front of the stationary plate 12m, projecting towards the object side, parallel to the optical axis O. The fixed lens barrel block 12 is further provided, between the stationary plate 12m and the cylindrical portion 12p, with a cutout portion 12k extending in the optical axis direction. The cutout portion 12k is formed by cutting out a part of the cylindrical portion 12p. One end of a flexible printed circuit board 6 (a fixed end portion 6h), the other end of which is secured to the AF/AE shutter unit 21 as shown in FIG. 11, is fixed and supported on the front of the stationary plate 12m by the projections 12n, with an intermediate part of the flexible printed circuit board 6 being laid along the cutout portion 12k. The one end of the flexible printed circuit board 6, fixed on the front of the stationary plate 12m, is electrically connected to a controller 75 provided in the camera body. A CPU (not shown) serves as the controller 75 and also serves as the whole optical unit driving motor controller 60, the rear lens group driving motor controller 61, the object distance measuring apparatus 64, the photometering apparatus 65 and the AE motor controller 66. The zoom operating device 62 and the focusing operating device are each connected to the CPU.

Figure 12:
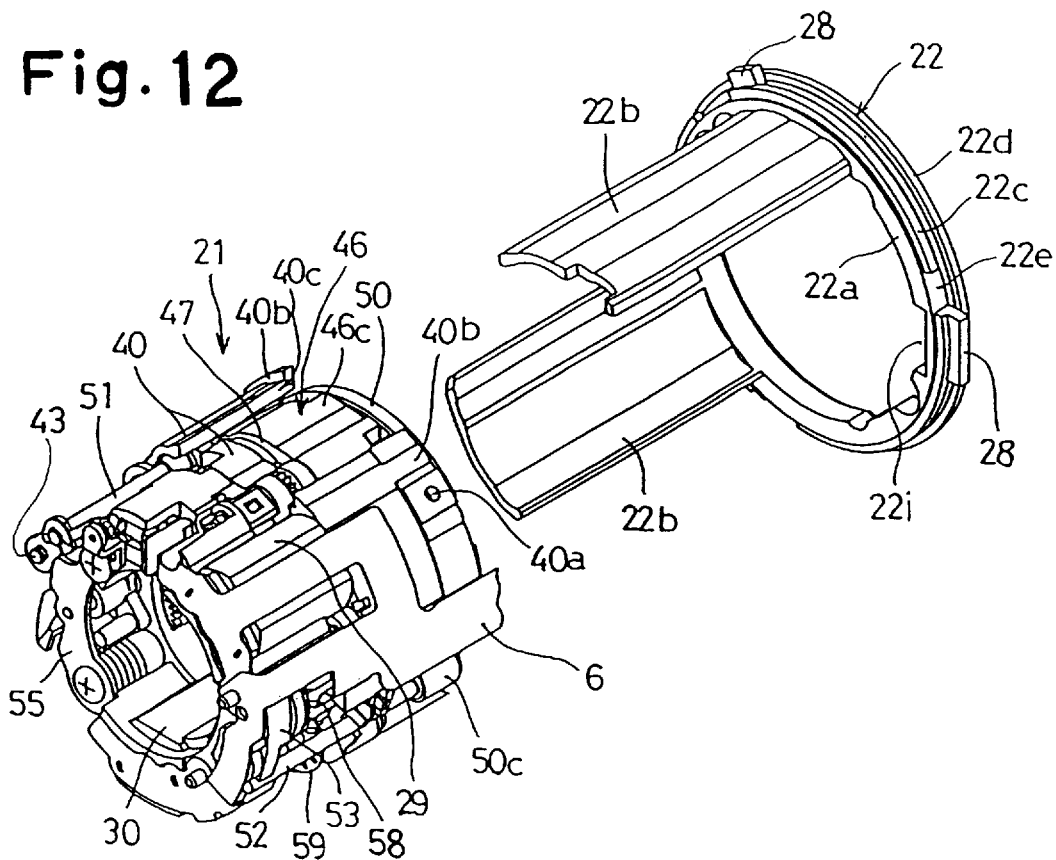
FIG. 12 is an enlarged schematic perspective view showing a part of the zoom lens barrel.

On an inner periphery of the third moving barrel 16, a plurality of linear guide grooves 16c are formed, each extending parallel to the optical axis O. At an outer periphery of the rear end of the third moving barrel 16, a male helicoid 16a and the aforementioned outer peripheral gear 16b are provided as shown in FIG. 12. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third moving barrel 16 in the optical axis direction.

Figure 8:
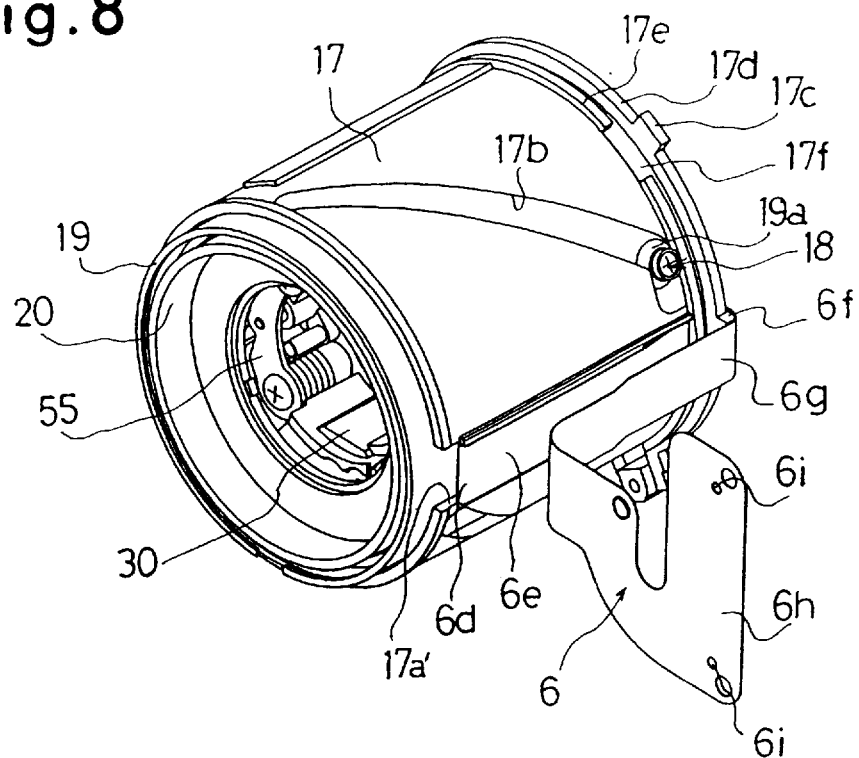
FIG. 8 is a schematic perspective view of a linear guide barrel in which the second moving barrel shown in FIG. 7 is accommodated, illustrating a positional relationship between the flexible printed circuit board and the linear guide barrel.
Figure 9:
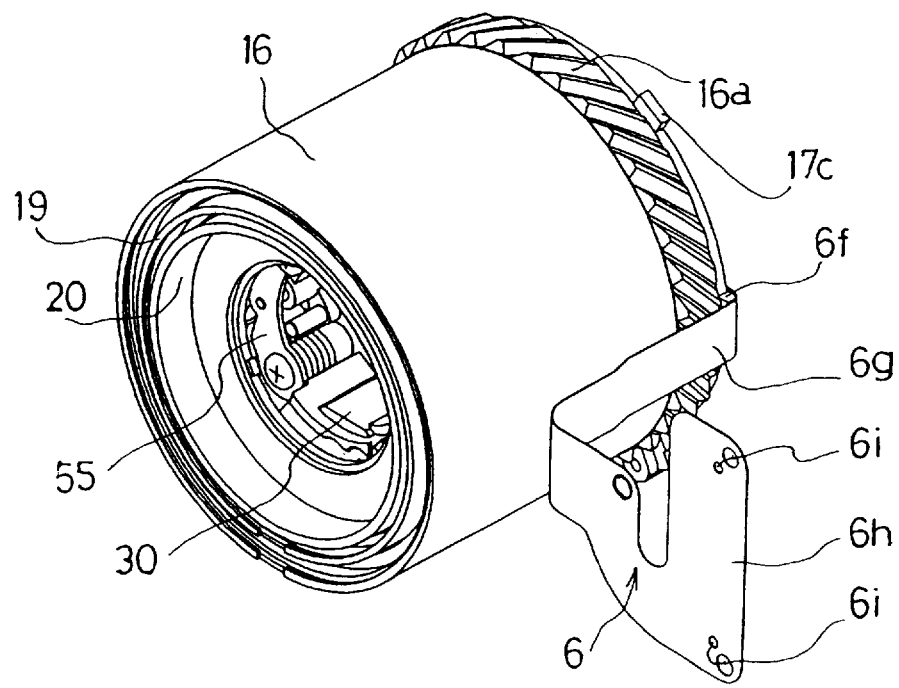
FIG. 9 is a schematic perspective view of a third moving barrel in which the linear guide barrel shown in FIG. 8 is accommodated, illustrating a positional relationship between the flexible printed circuit board and the third moving barrel.
Figure 10:
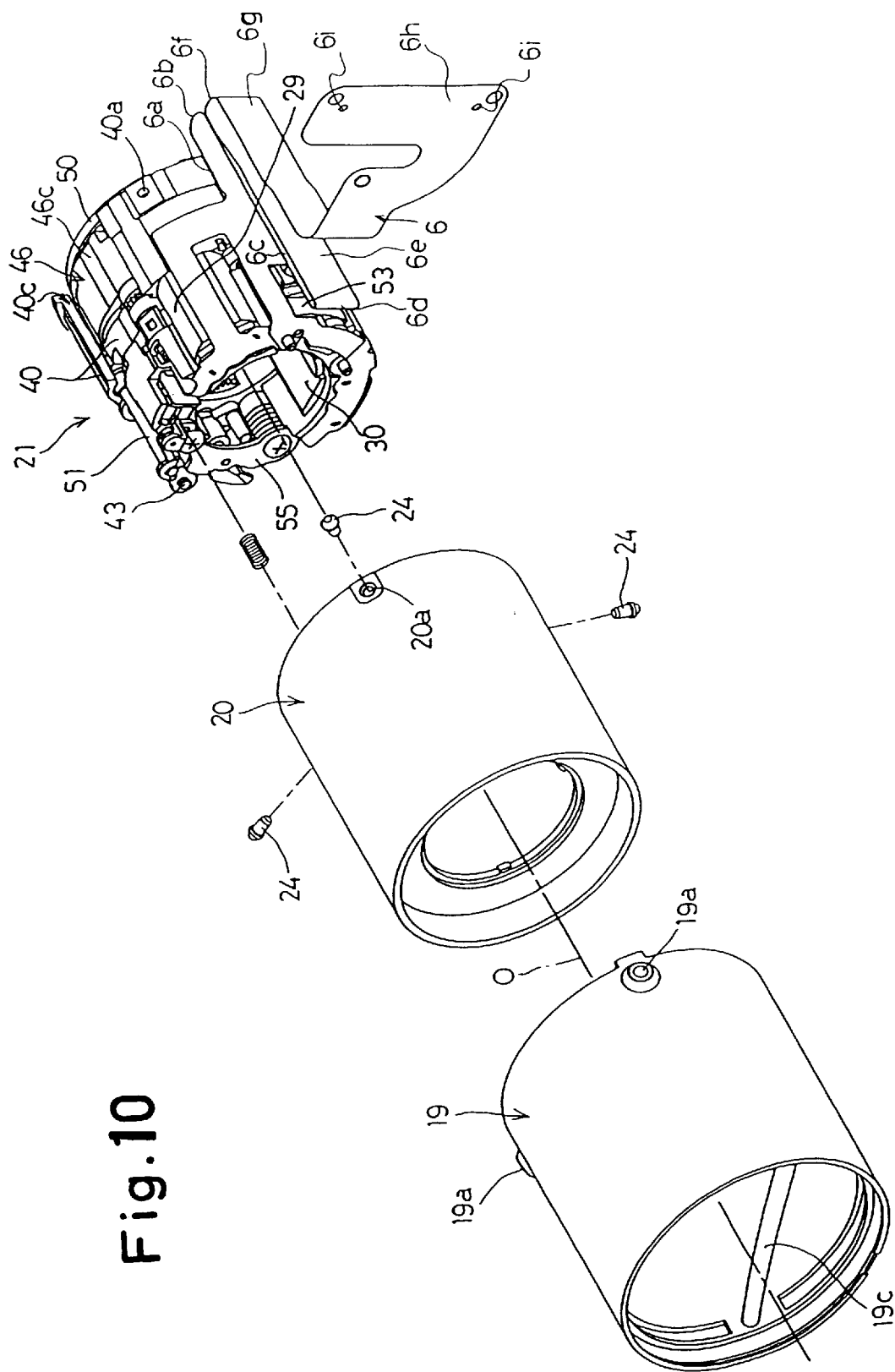
FIG. 10 is an enlarged exploded perspective view of a part of the zoom lens barrel.

As shown in FIG. 8, the linear guide barrel 17 is provided, on a rear part of an outer periphery thereof, with a rear end flange 17d. The rear end flange 17d has a plurality of engaging projections 17c each projecting away from the optical axis O in a radial direction. The linear guide barrel 17 is further provided with a retaining flange 17e in front of the rear end flange 17d. A circumferential groove 17g is formed between the rear end flange 17d and the retaining flange 17e. The retaining flange 17e has a radius smaller than the rear end flange 17d. The retaining flange 17e is provided with a plurality of cutout portions 17f. Each of the cutout portions 17f allows a corresponding engaging projection 16d to be inserted into the circumferential groove 17g, as shown in FIG. 2.

The third moving barrel 16 is provided, on an inner periphery of the rear end thereof, with a plurality of engaging projections 16d. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 2). By rotating the third moving barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed to the read-end of the linear guide barrel 17.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

Figure 18:
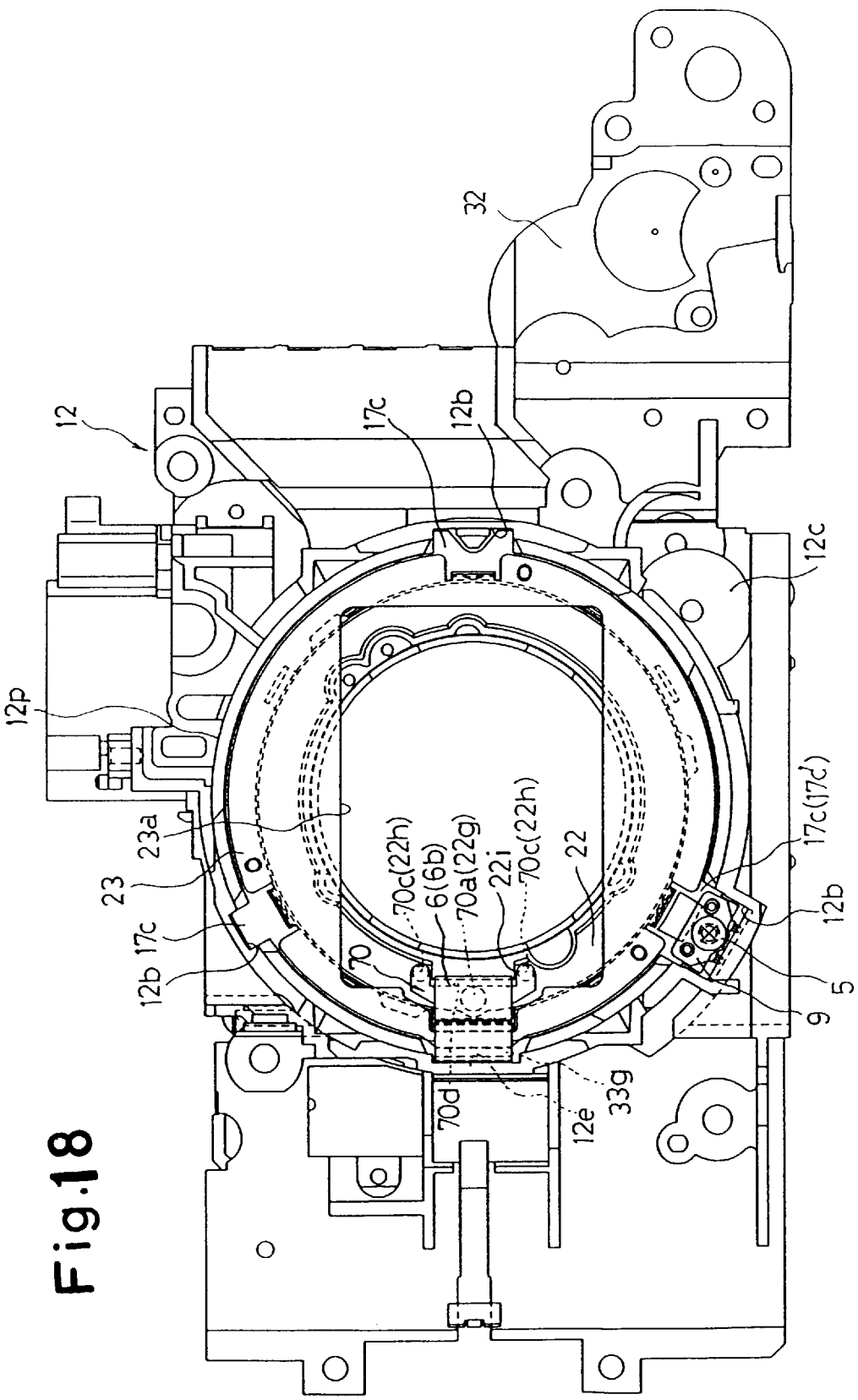
FIG. 18 is a rear elevational view of the zoom lens barrel and the fixed lens barrel block.

A contacting terminal (electric brush) 9 is fixed to one of the engaging projections 17c, namely 17c', by a set screw 5, as shown in FIGS. 2 and 18. The contacting terminal 9 is in slidable contact with the code plate 13a, fixed to the bottom of the linear guide groove 12b' to generate signals corresponding to focal length information during zooming.

FIG. 22 shows a part of the flexible printed circuit board 13 which is provided with a code plate 13a integrally formed therewith. In FIG. 22, the oblique-lined area on the flexible printed circuit board 13 represents the code plate 13a, that is, a portion of the flexible printed circuit board 13 on which a predetermined code pattern (not shown) is printed. A covering layer is not formed on the surface of the code plate 13a so that the contacting terminal 9 can contact with the code pattern formed on the code plate 13a. The non-oblique-lined area 13c on the flexible printed circuit board 13 in FIG. 22 represents a portion of the flexible printed circuit board 13 on which the covering layer is formed to protect a circuit pattern printed underneath the covering layer. The flexible printed circuit board 13 is bent at a bent portion 13b. A line "X—X" shown in FIG. 22 represents an apex of the bent portion 13b. A border 13e of the covering layer is formed as a curved border having a predetermined radius "R", with the center of the curved border 13e being closer to the apex "X—X" than each side end of the border 13e. The curved border 13e is located in the vicinity of the apex of the bent portion "X—X" but is located apart therefrom.

The feature of the flexible printed circuit board 13 of the present embodiment will be better understood by comparing the structure with a conventional structure.

FIG. 21 shows a flexible printed circuit board 130, which corresponds to the flexible printed circuit board 13 of the present embodiment, but is integrally formed with a code plate 130a having a conventional structure.

In FIG. 21, the oblique-lined area on the flexible printed circuit board 130 represents the code plate 130a, that is, a portion of the flexible printed circuit board 130 on which a predetermined code pattern (not shown) is printed. A covering layer is not formed on the entire surface of the code plate 130a. The non-oblique-lined area 13c' on the flexible printed circuit board 130 is FIG. 21 represents a portion of the flexible printed circuit board 130 on which a covering layer is formed to protect a circuit pattern printed underneath the covering layer. The flexible printed circuit board 130 is bent at a bent portion 13b'. A line "X—X" shown in FIG. 21 represents an apex of the bent portion 13b'. A border 13e' of the covering layer is formed as a straight border. The straight border 13e' is located in the vicinity of the apex of the bent portion "X—X" but is located apart therefrom, similar to that shown in FIG. 22.

Bending stress which occurs in the vicinity of the bent portion 13b' is concentrated on the straight border 13e' of the flexible printed circuit board 130, since no covering layer is formed there. The strength of the flexible printed circuit board 130 along the border 13e' is accordingly weaker than the portion of the flexible printed circuit board 130 on which the covering layer is formed. In addition, since the border 13e' extends in a direction perpendicular to a longitudinal direction of the flexible printed circuit board 130 (horizontal direction as viewed in FIG. 21), the bending stress uniformly acts on the flexible printed circuit board 130 along the straight border 13e', i.e., along a width-wise direction of the flexible printed circuit board 130. This causes the flexible printed circuit board 130 to be badly damaged along the straight border 13e', thus resulting in a disconnection of the printed circuit.

However, according to the flexible printed circuit board 13 of the present embodiment shown in FIG. 22, although the bending stress occurs in the vicinity of the bent portion 13b is concentrated on the curved border 13e, the total bending stress acting on the border 13e decreases since the bending stress concentrated on the curved border 13e decreases away from the center of the curved border 13e. In other words, the bending stress disperses in a longitudinal direction (horizontal direction as viewed in FIG. 22) of the flexible printed circuit board 13. The reason for this is because each edge of the border 13e curves away from the bent portion 13b toward the code plate 13a by a predetermined distance "s" with respect to the center of the border 13e. Namely, in the case where the distance between the apex "X—X" and the center of the curved border 13e in FIG. 22 is identical to the distance between the apex "X—X" and the straight border 13e' in FIG. 21, the bending stress uniformly acts on the straight border 13e' in the case of the flexible printed circuit board 130, whereas the bending stress acting on each side end of the curved border 13e is smaller than that acting on each side end of the straight border 13e' since each side end of the curved border 13e is positioned farther from the bent portion 13b.

Figure 23:
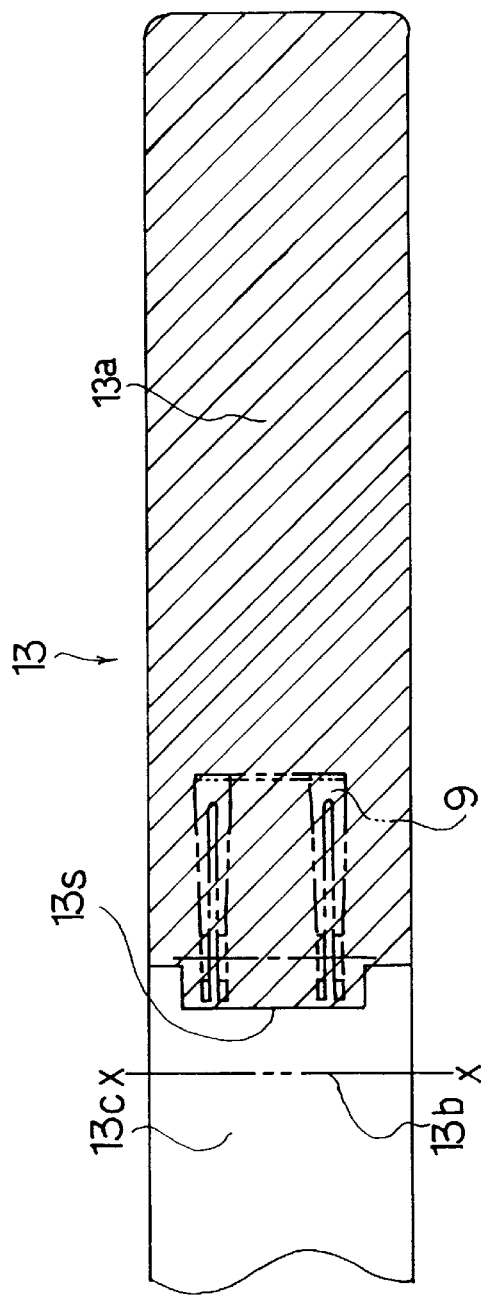
FIG. 23 is a schematic plan view of another embodiment of a code plate which may be used instead of the code plate shown in FIG. 22.
Figure 24:
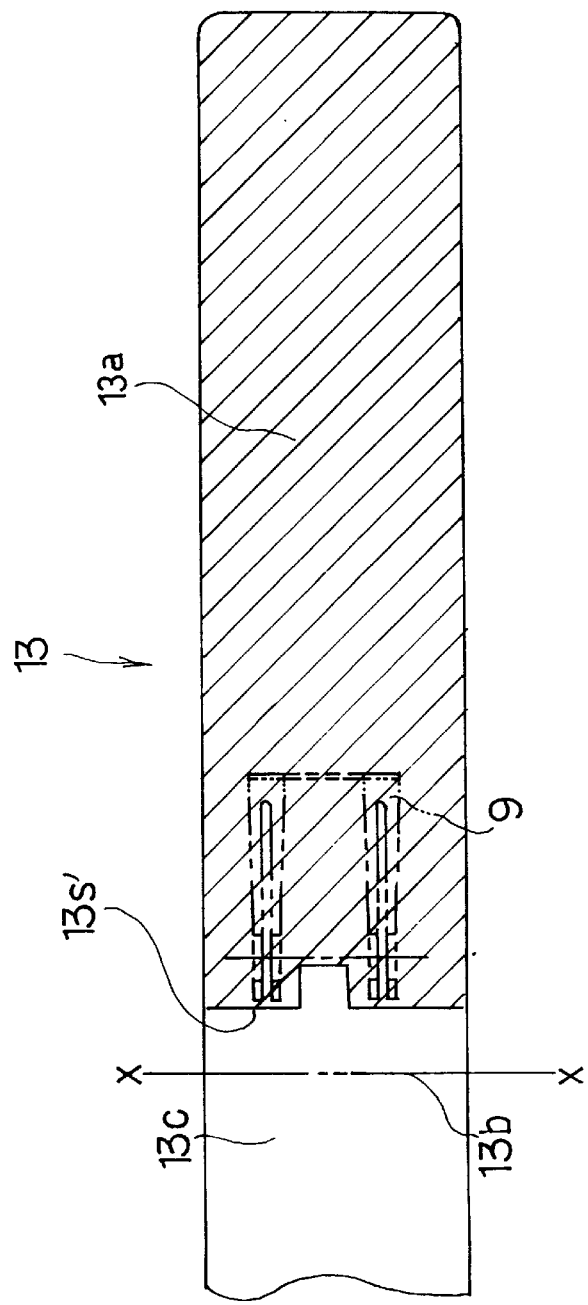
FIG. 24 is a schematic plan view of yet another embodiment of a code plate which may be used instead of the code plate shown in FIG. 22.

FIGS. 23 and 24 each show another embodiment of the flexible printed circuit board 13 which is provided with the code plate 13a having a border 13s or 13s' whose shape is different from that of the straight boarder 13e'. As shown in FIGS. 23 or 24, the shape of the border of the covering layer is not fitted solely to a curved shape as shown in FIG. 22, but may be any other shape as long as the border of the covering layer is not shaped as a straight border extending perpendicular to the longitudinal direction of the flexible printed circuit board 13 so that the bending stress does not uniformly act on the border therealong. A similar effect can be expected according to either of the embodiments shown in FIGS. 23 and 24.

Figure 25:
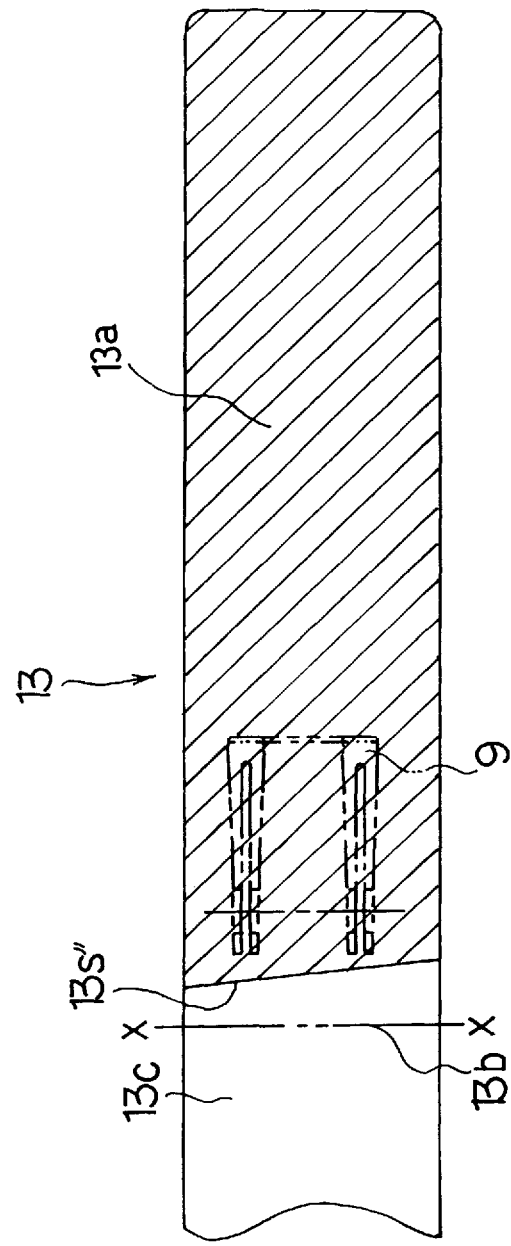
FIG. 25 is a schematic plan view of yet another embodiment of a code plate which may be used instead of the code plate shown in FIG. 22.

FIG. 25 shows still another embodiment of the flexible printed circuit board 13 which is provided with the code plate 13a having a border 13s" extending in a direction oblique to a longitudinal direction of the flexible printed circuit board 13, that is, extending in a direction oblique to the apex "X—X". A similar effect can also be expected according to this embodiment.

A plurality of linear guide grooves 17a are formed on the inner periphery of the linear guide barrel 17, each extending parallel to the optical axis O. A plurality of lead slots (cam slots) 17b are also formed on the linear guide barrel 17 as shown in FIGS. 8 or 19. The lead slots 17b are each formed oblique (inclined) to the optical axis O.

Figure 3:
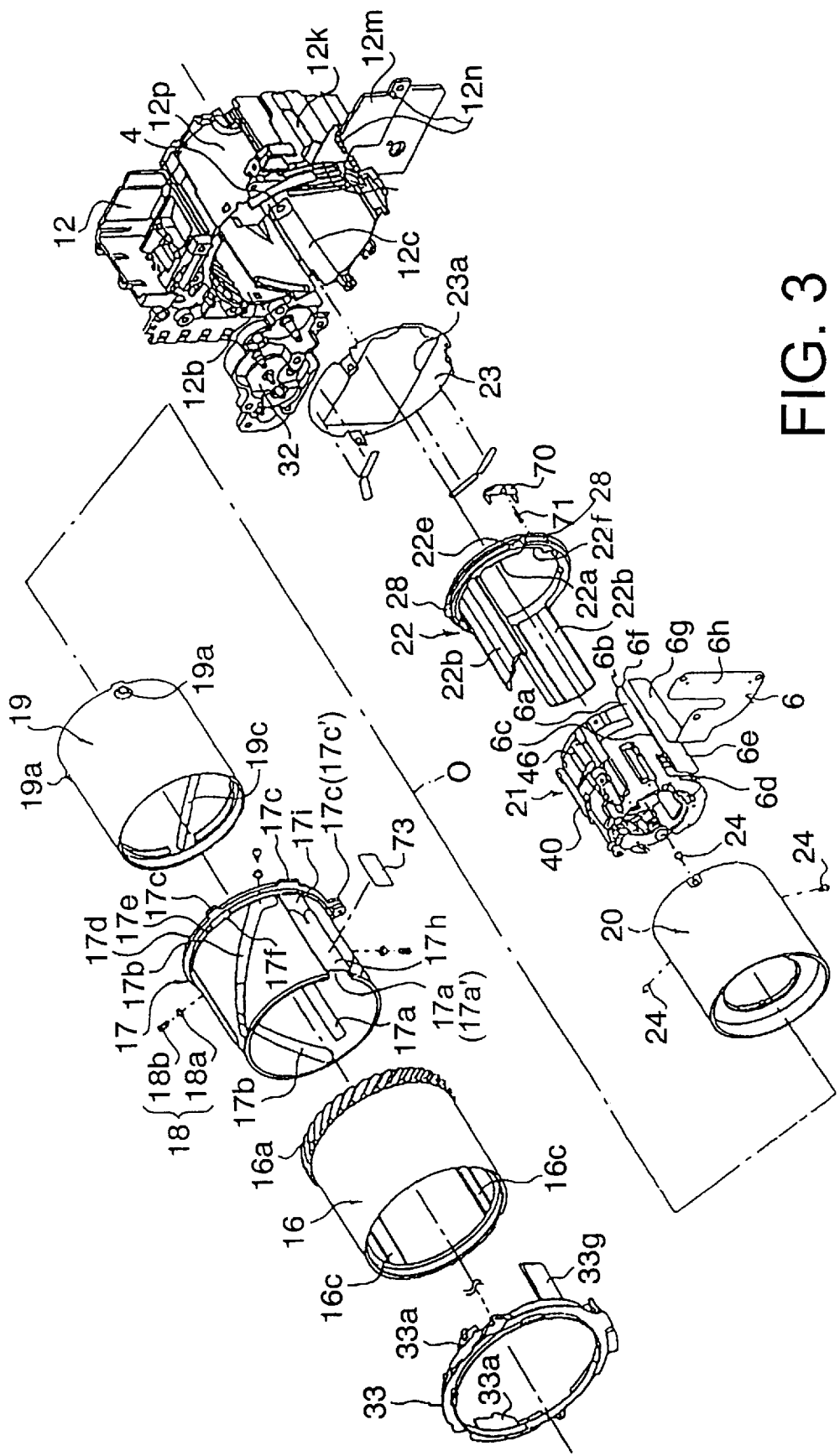
FIG. 3 is an exploded perspective view of a part of the zoom lens barrel.

One of the linear guide grooves 17a, e.g., a linear guide groove 17a', is provided at a rear end with a hold 17i, as shown in FIG. 3. A part of the flexible printed circuit board 6 that is formed in a strip-shape is positioned along the linear guide groove 17a' through the hole 17i.

The second moving barrel 19 engages with the inner periphery of the linear guide barrel 17. On the inner periphery of the second moving barrel 19, a plurality of lead grooves 19c are provided in a direction inclined oppositely to the lead slots 17b. Each lead groove 19c is oblique to both the optical axis direction and a circumferential direction of the linear guide barrel 17 by a predetermined angle, similar to each lead slot 17b. On the outer periphery of the rear end of the second moving barrel 19, a plurality of follower projections 19a are provided. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating.

On the inner periphery of the second moving barrel 19, the first moving barrel 20 is engaged. The first moving barrel 20 is provided on an outer periphery of the rear thereof with a plurality of follower pins 24 each engaging with the corresponding inner lead groove 19c. At the same time the first moving barrel 20 is guided linearly by a linear guide member 22. The first moving barrel 20 is provided at the front end thereof with a decorative plate 41.

Figure 13:
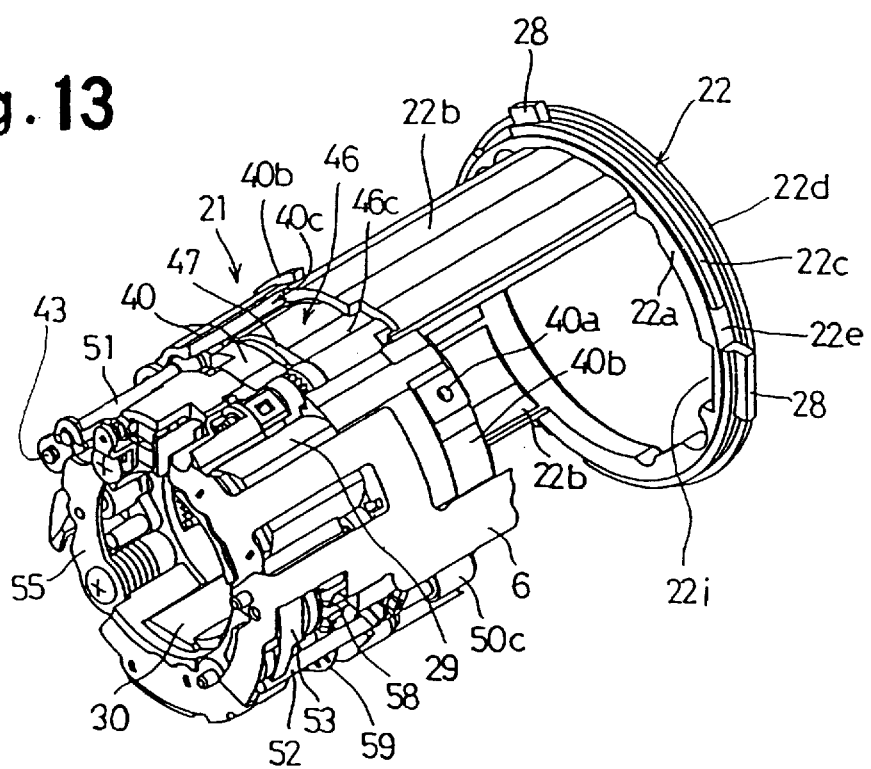
FIG. 13 is a schematic perspective view showing the part of the zoom lens barrel shown in FIG. 12 in an engaged state.

As shown in FIGS. 12 and 13, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first moving barrel 20 and the AF/AE shutter unit 21.

The annular member 22a of the linear guide member 22 is connected to the rear of the second moving barrel 19, such that the linear guide member 22 and the second moving barrel 19 are capable of moving along the optical axis O as a whole and relatively rotating around the optical axis O. The linear guide member 22 is further provided on the outer periphery of the rear end with a rear end flange 22d. The linear guide member 22 is further provided in front of the rear end flange 22d with a retaining flange 22c. A circumferential groove 22f is formed between the rear end flange 22d and the retaining flange 22c. The retaining flange 22c has a smaller radius than the rear end flange 22d. The retaining flange 22c is provided with a plurality of cutout portions 22e, as shown in FIGS. 12 or 13, each allowing a corresponding engaging projection 19b to be inserted into the circumferential groove 22f, as shown in FIG. 2.

The second moving barrel 19 is provided on an inner periphery of the rear end thereof with a plurality of engaging projections 19b, each projecting towards the optical axis O in a radial direction. By inserting the engaging projections 19b into the circumferential groove 22f through the corresponding cutout portions 22e, the engaging projections 19b are positioned in the circumferential groove 22f between the flanges 22c and 22d. By rotating the second moving barrel 19 relative to the linear guide member 22, the engaging projections 19b are engaged with the linear guide member 22. With the above structure, when the second moving barrel 19 rotates in the forward or reverse rotational direction, the first moving barrel 20 moves linearly forwardly or rearwardly along the optical axis O, but is restricted from rotating.

Figure 4:
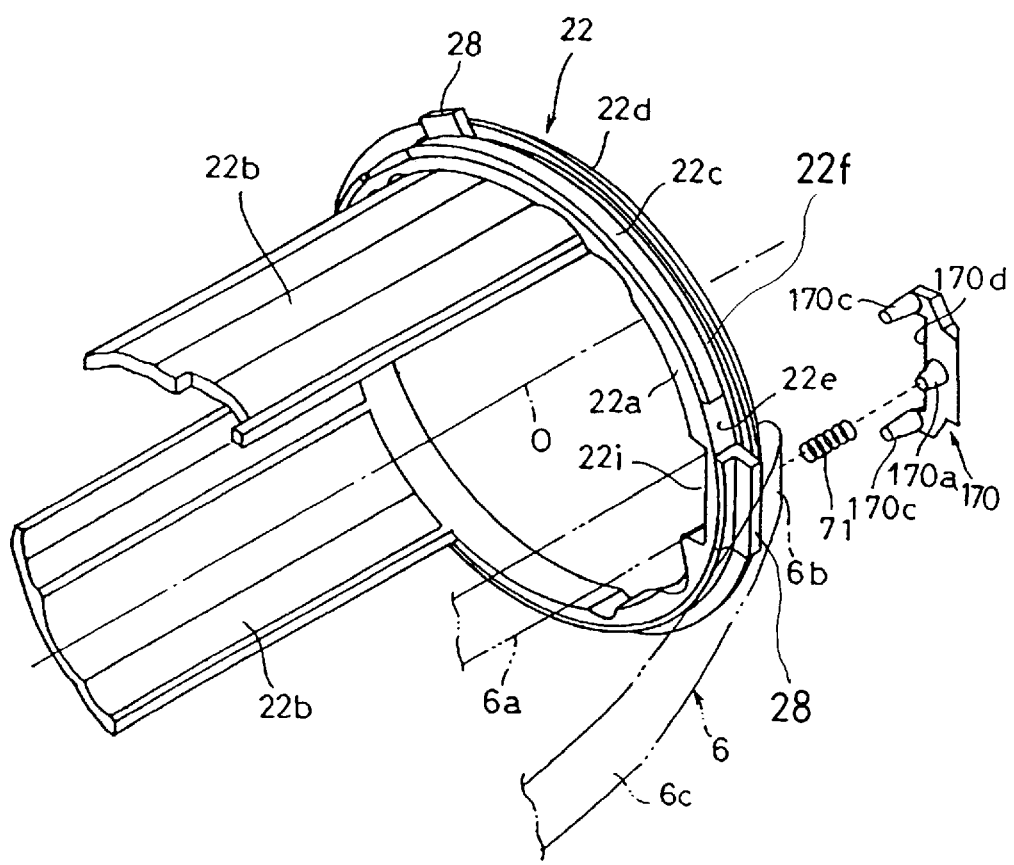
FIG. 4 is an enlarged exploded perspective view of a part of the zoom lens barrel, showing a linear guide member, a pressing member and a coil spring.
Figure 5:
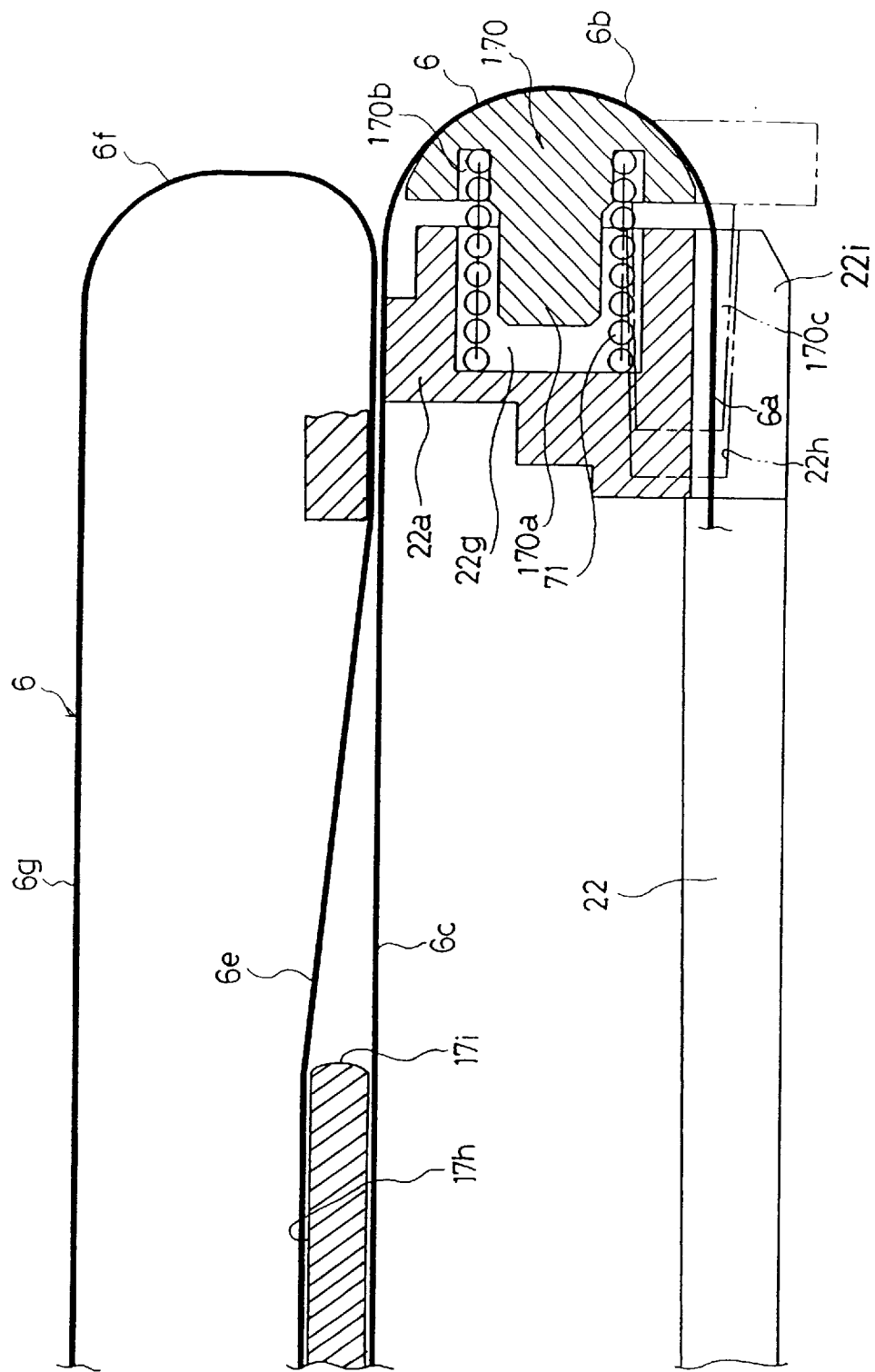
FIG. 5 is a schematic sectional view of a part of the zoom lens barrel, showing a relationship among the linear guide member, the pressing member and a flexible printed circuit board.
Figure 6:
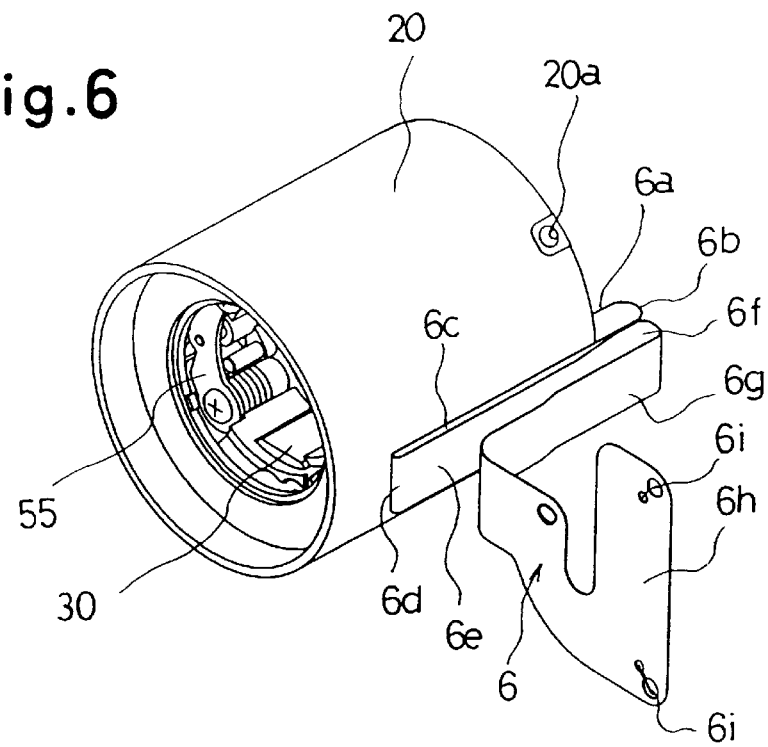
FIG. 6 is a schematic perspective view of a first moving barrel having an AF/AE shutter unit therein, illustrating a positional relationship between the flexible printed circuit board and the first moving barrel.
Figure 7:
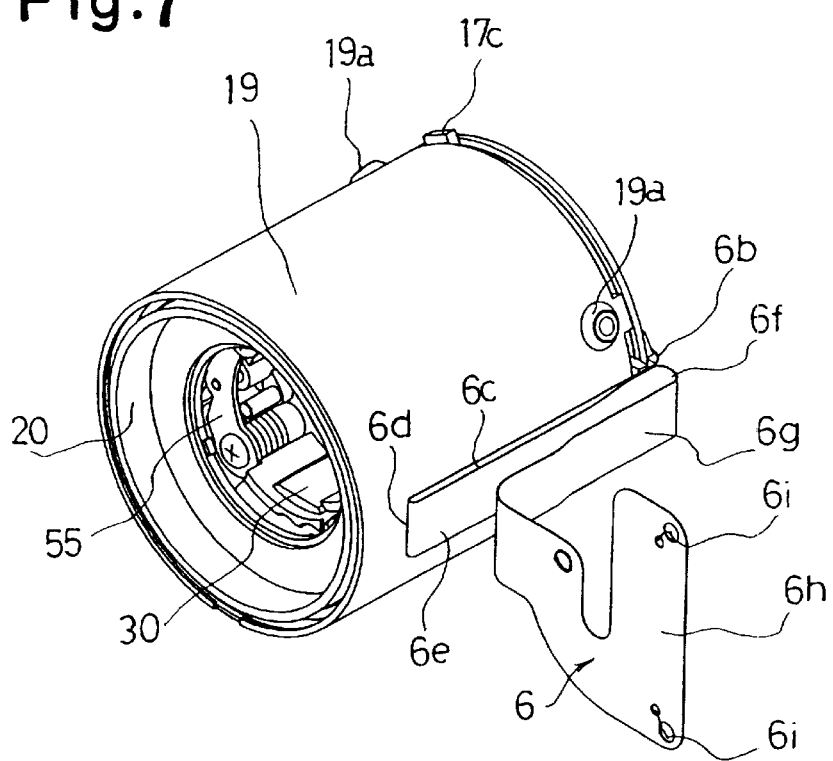
FIG. 7 is a schematic perspective view of a second moving barrel in which the first moving barrel shown in FIG. 6 is accommodated, illustrating a positional relationship between the flexible printed circuit board and the second moving barrel.

A pressing member 170 engages with the annular member 22a at a rear end thereof, with a coil spring (compression spring) 71 positioned therebetween as shown in FIGS. 4 or 5. The pressing member 170 biases a first U-shaped bent portion 6b of the flexible printed circuit board 6 rearward due to a biasing force of the coil spring 71. An inner groove 22i (FIG. 4) is formed on an inner periphery of the annular member 22a in the vicinity of the pressing member 170. A first non-bent portion or straight portion 6a of the flexible printed circuit board 6 is positioned in the inner groove 22i.

The pressing member 170 is provided with a pair of pins 170c extending forwardly in the optical axis direction, a projection 170a extending forwardly between the pair of pins 170c, and a circular groove 170b (FIG. 5) formed around the root of the projection 170a. The projection 170a engages with the coil spring 71 with the rear end of the coil spring 71 being positioned in the circular groove 170b as shown in FIG. 5. On a rear surface of the annular member 22a, a pair of guide holes 22h and a circular hole 22g are provided. The pair of guide holes 22h respectively and slidably receive the pair of pins 170c. A front end of the coil spring is inserted in the circular hole 22g. The pressing member 170 is further provided with a recessed groove 170d (FIG. 4). The recessed groove 170d is aligned with the inner groove 22i in the optical axis direction when the pressing member properly engages with the annular member 22a with the pair of pins 170c being respectively fitted in the pair of guide holes 22h. Due to these structures, the pressing member 170 is movable relative to the annular member 22a in the optical axis direction.

Figure 26:
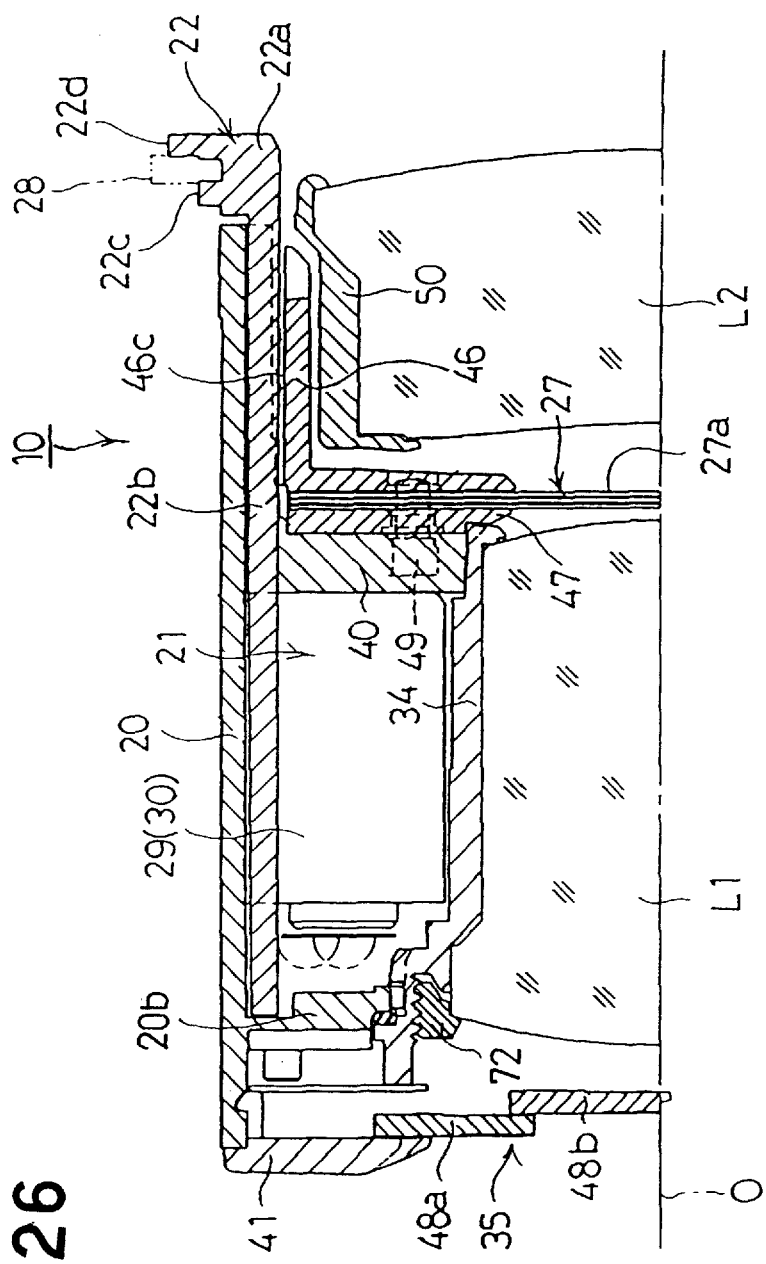
FIG. 26 is a sectional view of an upper part of the zoom lens barrel, illustrating essential elements in the housed state.

At the front of the first moving barrel 20, a barrier apparatus 35 having barrier blades 48a and 48b is mounted. On an inner peripheral face of the first moving barrel 20, the AF/AE shutter unit 21 having the shutter 27, consisting of three shutter blades 27a, is engaged and fixed as shown in FIG. 26. The AF/AE shutter unit 21 is provided with a plurality of fixing holes 40a formed at even angular intervals on the outer periphery of the shutter mounting stage 40. Only one of the fixing holes 40a appears in each of FIGS. 10–14.

The aforementioned plurality of follower pins 24, which engage with the inner lead grooves 19c, also serve as a device for fixing the AF/AE shutter unit 21 to the first moving barrel 20. The follower pins 24 are inserted in holes 20a, formed on the first moving barrel 20, and fixed in the fixing holes 40a. With this arrangement the AF/AE shutter unit 21 is secured to the first moving barrel 20 as shown in FIG. 4. In FIG. 11 the first moving barrel 20 is indicated by phantom lines. The follower pins 24 may be fixed by an adhesive, or the pins 24 may be formed as screws to be screwed into the fixing holes 40a.

Figure 14:
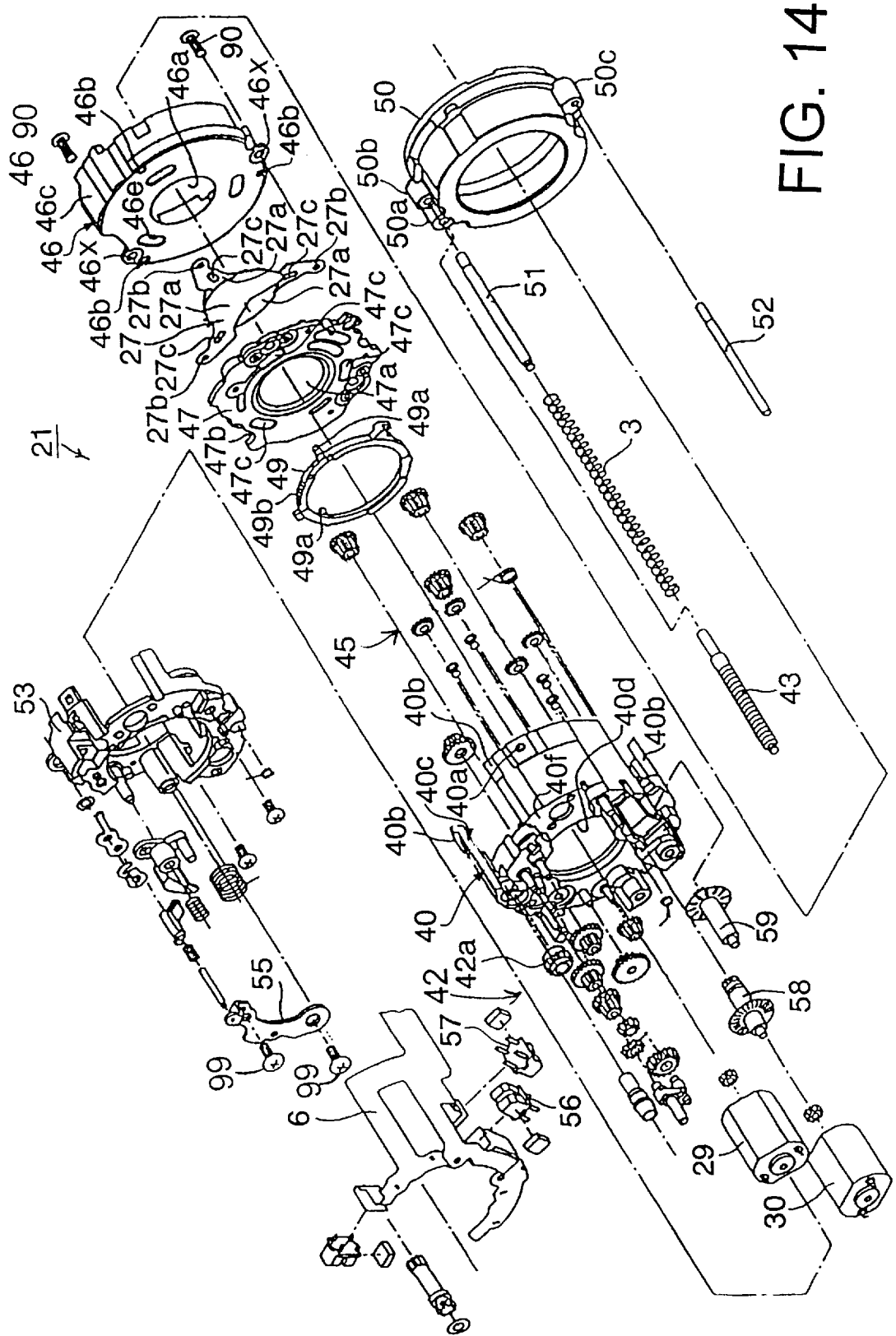
FIG. 14 is an exploded perspective view illustrating main parts of the AF/AE shutter unit of the zoom lens barrel shown in FIGS. 10, 11, 12 or 13.
Figure 15:
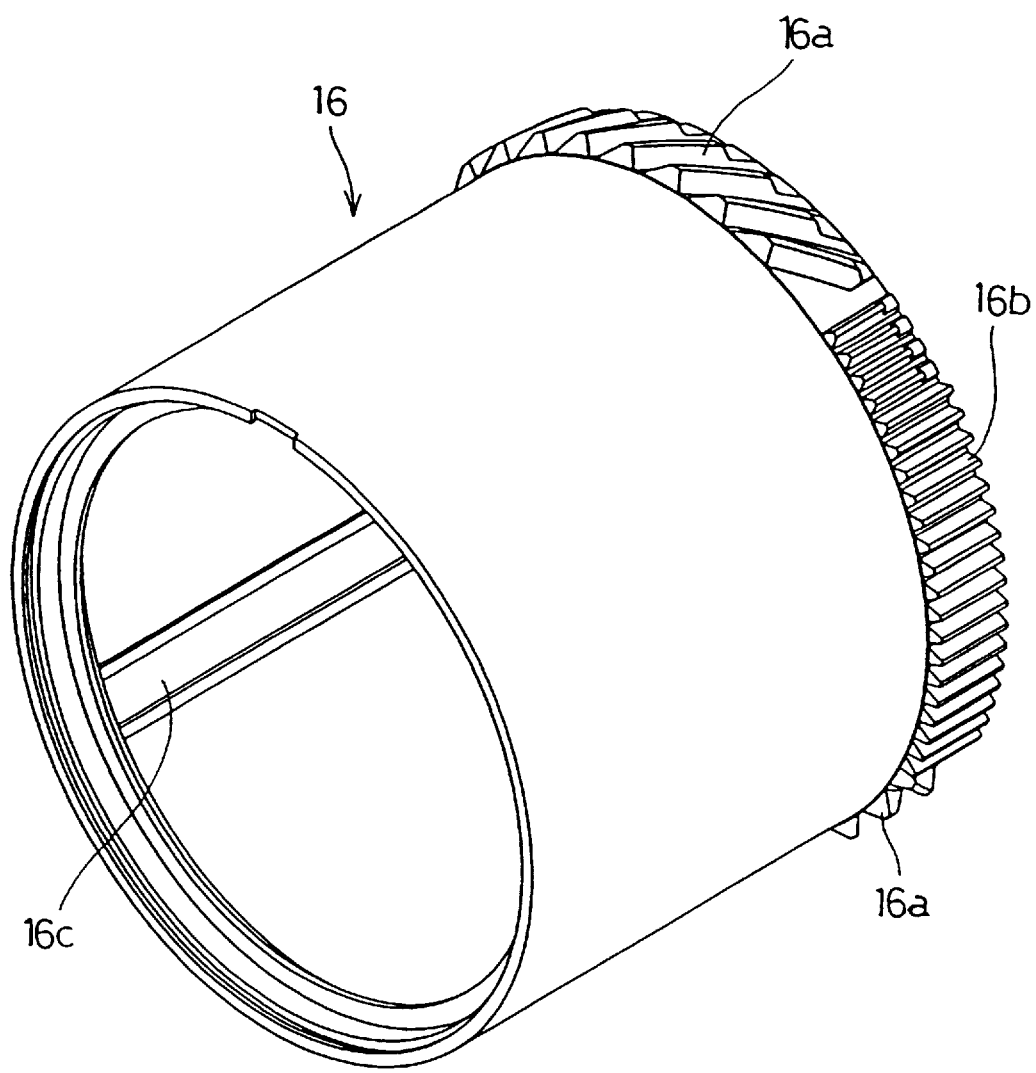
FIG. 15 is an enlarged schematic perspective view of the third moving barrel.
Figure 16:
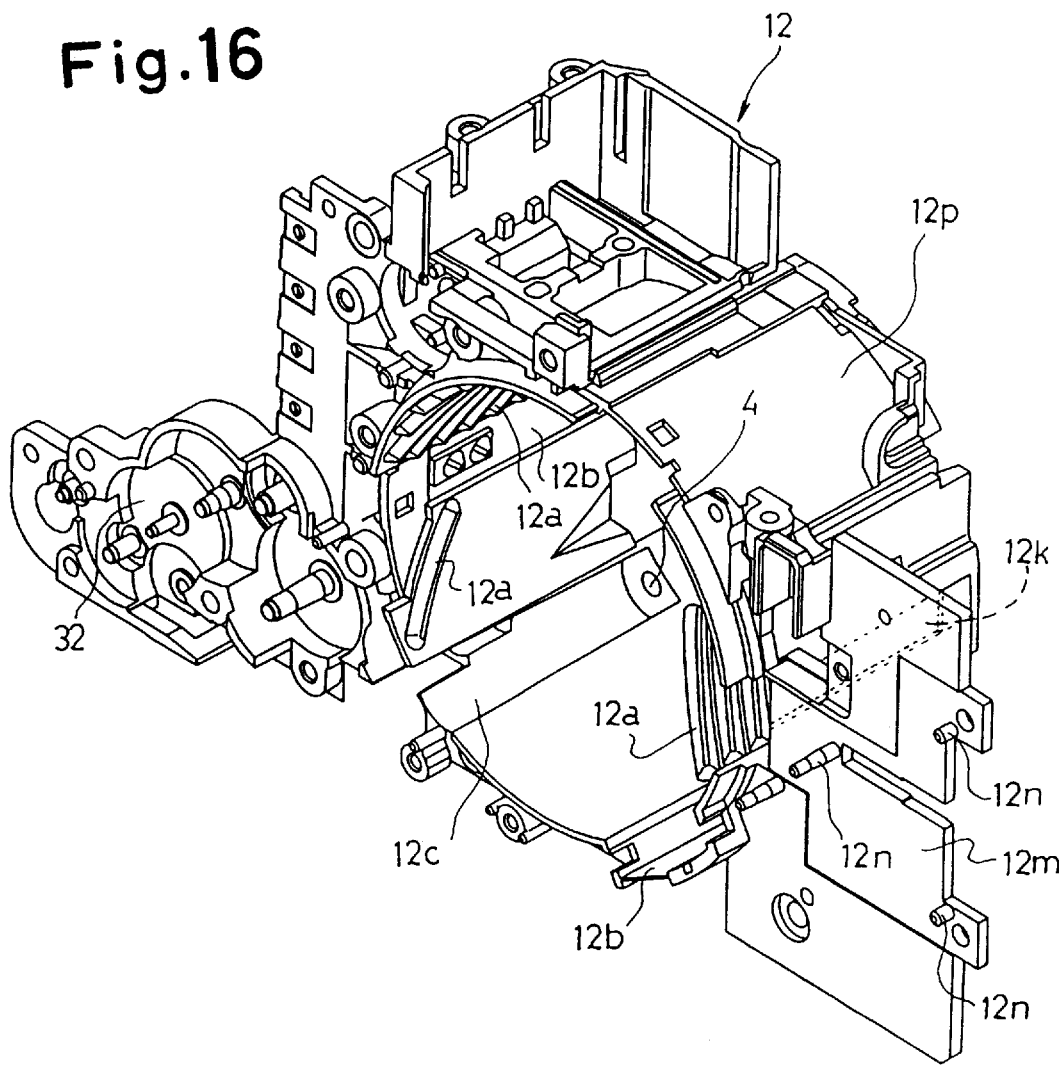
FIG. 16 is an enlarged schematic perspective view of a fixed lens barrel block of the zoom lens barrel.

As illustrated in FIGS. 14 and 19, the AF/AE shutter unit 21 is provided with the shutter mounting state 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. The shutter mounting stage 40 supports the lens supporting barrel 34, the AE motor 29, and the rear lens group driving motor 30. The shutter mounting stage 40 is provided with an annular member 40f having a circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22 so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft 43, photointerrupters 56 and 57 which are connected to a flexible printed circuit board 6, and rotating disks 58 and 59 which have a plurality of radially formed slits provided in the circumferential direction. An encoder for detecting whether the rear lens group driving motor 30 is rotating and for detecting an amount of rotation of the rear lens group driving motor 30 consists of the photointerrupter 57 and the rotating disk 59. An AE motor encoder for detecting whether the AE motor 29 is rotating and for detecting an amount of rotation of the AE motor 29 consists of the photointerrupter 56 and the rotating disk 58.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 14, the front end of the shutter blade supporting ring 46 is provided with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 14) at respective positions opposite the three supporting holes 46b. Each shutter blade 27a is provided at one end thereof with a hole 27b into which the corresponding pivotal shaft 47b is inserted, so that each shutter blade 27a is rotatable about the corresponding pivotal shaft 47b. The major part of each shutter blade 27a, that extends normal to the optical axis O from the pivoted end, is formed as a light interceptive portion. All three light interceptive portions of the shutter blades 27a together prevent ambient light, which enters the front lens group L1 from entering the circular apertures 46a and 47a when the shutter blades 27a are closed. Each shutter blade 27a is further provided between the hole 27b and the light interceptive portion thereof with a slot 27c through which the corresponding operating projection 49a is inserted. The supporting member 47 is fixed to the shutter blade supporting ring 46 in such a manner that each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40 to support the circular driving ring 49, the supporting member 47 and the shutter 27, and is fixed on the shutter mounting stage 40 by set screws 90 respectively inserted through holes 46x provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center thereof and is restricted to move in the axial direction. The screw shaft 43, one end of which is fixed to the lens supporting barrel 50, engages with the female thread hole. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 respectively moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws 99. The motors 29, 30 and the photointerrupters 56, 57 are connected to the flexible printed circuit board 6. One end of the flexible printed circuit board 6 is fixed to the shutter mounting stage 40.

After the first, second and third moving barrels 20, 19 and 16, and the AF/AE shutter unit 21, etc. are assembled, the aperture plate 23 is fixed to the rear of the linear guide barrel 17, and an annular retaining member 33 is fixed at the front of the fixed lens barrel block 12.

Figure 1:
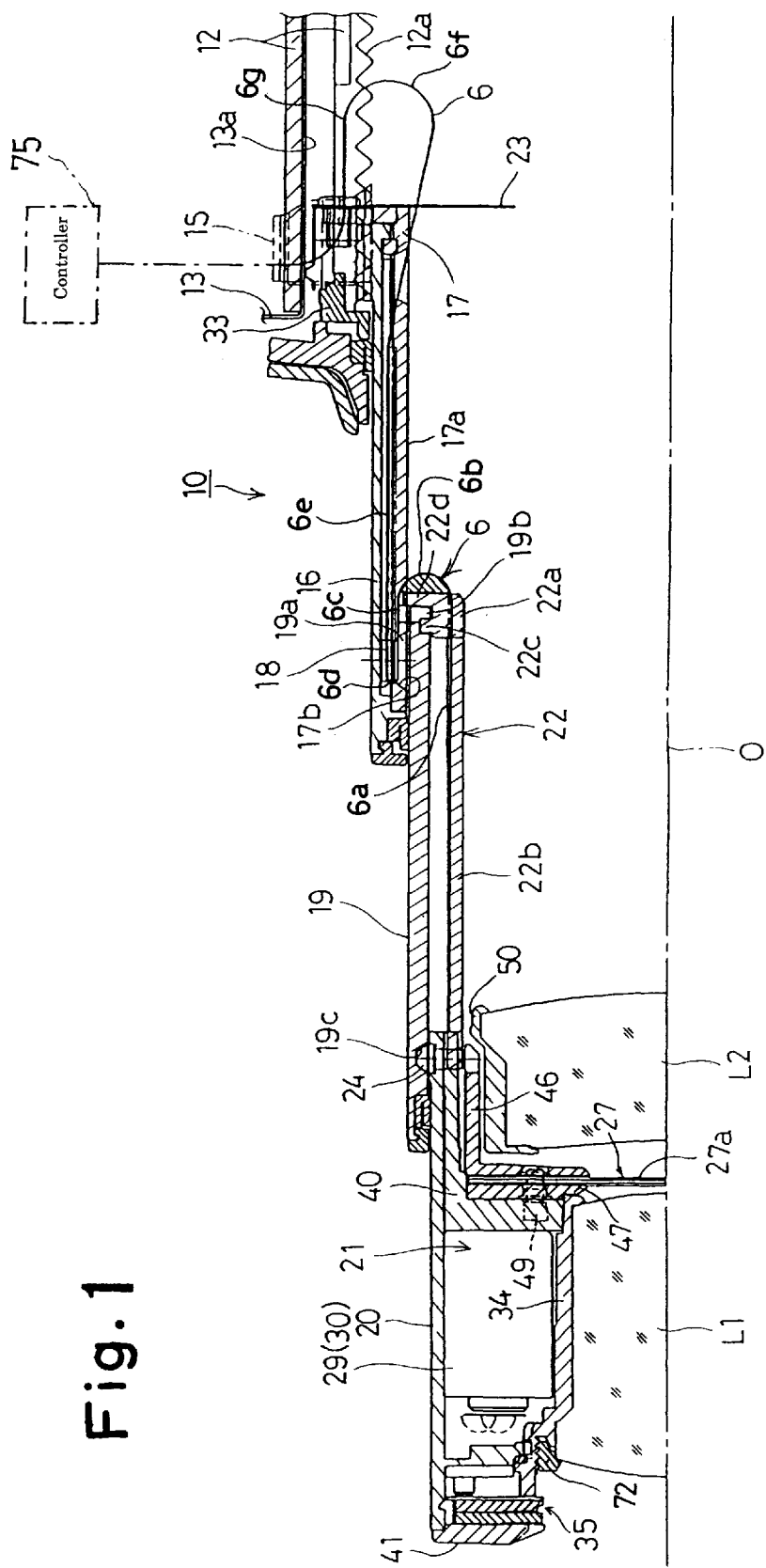
FIG. 1 is a sectional view of an upper part of a zoom lens barrel in a maximum extended state.

The long strip-shaped portion of the flexible printed circuit board 6 is positioned in the zoom lens barrel 10 in a manner as shown in FIGS. 1 or 2. The flexible printed circuit board 6 is provided with the aforementioned first straight portion 6a, which extends rearward from the AF/AE shutter unit 21 along an inner periphery of the second moving barrel 19; the aforementioned first U-shaped bent portion 6b, which passes through the guide groove 22i to be bent forwardly; a second straight portion 6c, which extends from the first bent portion 6b to the front end of the third moving barrel 16; and a second U-shaped bent portion 6d, which is bent rearwardly at the front end of the second straight portion 6c. The flexible printed circuit board 6 is further provided with a third straight portion 6e, which extends rearwardly from the second U-shaped bent portion 6d between an inner periphery of the third moving barrel 16 and an outer surface 17h of the linear guide barrel 17 that is adjacent to the linear guide groove 17a'; a third U-shaped bent portion 6f, which passes through the hole 17i and the cutout portion 12k; and a fourth straight portion 6g, which extends forwardly from the third U-shaped bent portion 6f, and the fixed end portion 6h, which is secured on the stationary plate 12m through the projections 12n. The third straight portion 6e may be attached to the outer periphery of the linear guide barrel 17 by using, for example, double-sided adhesive tape 73 as shown in FIG. 3.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens groups.

In addition, in the above embodiment, the rear lens group L1 is provided as a component of the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be realized by making the rear lens group L2 a member separate from the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by a supporting member other than the AF/AE shutter unit 21.

In the zoom lens camera of the present embodiment, the operation by rotation of the whole optical unit driving motor 25 and the rear lens group driving motor 30 will now be described with reference to FIGS. 1, 2, 26 ans 27.

As shown in FIGS. 2 or 26, when the zoom lens barrel 10 is at the most retracted (withdrawn) position, i.e., the lens-housed condition, when the power switch is turned ON, the whole optical unit driving motor 25 is driven to rotate its drive shaft in the forward rotational direction by a small amount. This rotation of the motor 25 is transmitted to the driving pinion 15 through a gear train 26, which is supported by a supporting member 32 integrally formed with the fixed lens barrel block 12, to rotate the third moving barrel 16 in one predetermined rotational direction to advance forwardly along the optical axis O. Therefore, the second moving barrel 19 and the first moving barrel 20 are each advanced by a small amount in the optical axis direction, along with the third moving barrel 16. Consequently, the camera is in a state capable of photographing, with the zoom lens positioned at the widest position, i.e., the wide end. At this stage, because the amount of movement of the linear guide barrel 17 with respect to the fixed lens barrel block 12 is detected through the relative slide between the code plate 13a and the contacting terminal 9, the focal length of the zoom lens barrel 10, i.e., the front and rear lens groups L1 and L2, is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60 so that the third moving barrel 16 rotates in the rotational direction to advance along the optical axis O via the driving pinion 15 and the outer peripheral gear 16b. Therefore, the third moving barrel 16 is advanced from the fixed lens barrel block 12 according to the relationship between the female helicoid 12a and the male helicoid 16a. At the same time, the linear guide barrel 17 moves forwardly in the optical axis direction together with the third moving barrel 16, without relative rotation to the fixed lens barrel block 12, according to the relationship between the engaging projections 17c and the linear guide grooves 12b. During this movement of the linear guide barrel 17, the contacting terminal 9 which is fixed to the linear guide barrel 17, slides along the code plate 13a to generate signals corresponding to the focal length varied in a zooming operation. Furthermore, during such a movement of the linear guide barrel 17, the simultaneous engagement of the follower pins 18 with the respective lead slots 17b and linear guide grooves 16c causes the second moving barrel 19 to move forwardly relative to the third moving barrel 16 in the optical axis direction, while rotating together with the third moving barrel 16 in the same rotational direction relative to the fixed lens barrel block 12. The first moving barrel 20 moves forwardly from the second moving barrel 19 in the optical axis direction together with the AF/AE shutter unit 21 without relative rotation to the fixed lens barrel block 12. This movement is due to the above-noted structures in which the first moving barrel 20 is guided linearly by the linear guide member 22 and in which the follower pins 24 are guided by the lead grooves 19c. During such movements, because the moving position of the linear guide barrel 17 with respect to the fixed lens barrel block 12 is detected through the relative slide between the code plate 13a and the contacting terminal 9, the focal length set by the zoom operation device 62 is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the optical unit driving motor controller 60 so that the third moving barrel 16 rotates to retract into the fixed lens barrel block 12 together with the linear guide barrel 17. At the same time, the second moving barrel 19 is retracted into the third moving barrel 16, while rotating in the same direction as that of the third moving barrel 16, and the first moving barrel 20 is retracted into the rotating second moving barrel 19 together with the AF/AE shutter unit 21. During the above retraction driving, as in the case of advancing driving as above described, the rear lens group driving motor 30 is not driven.

Figure 27:
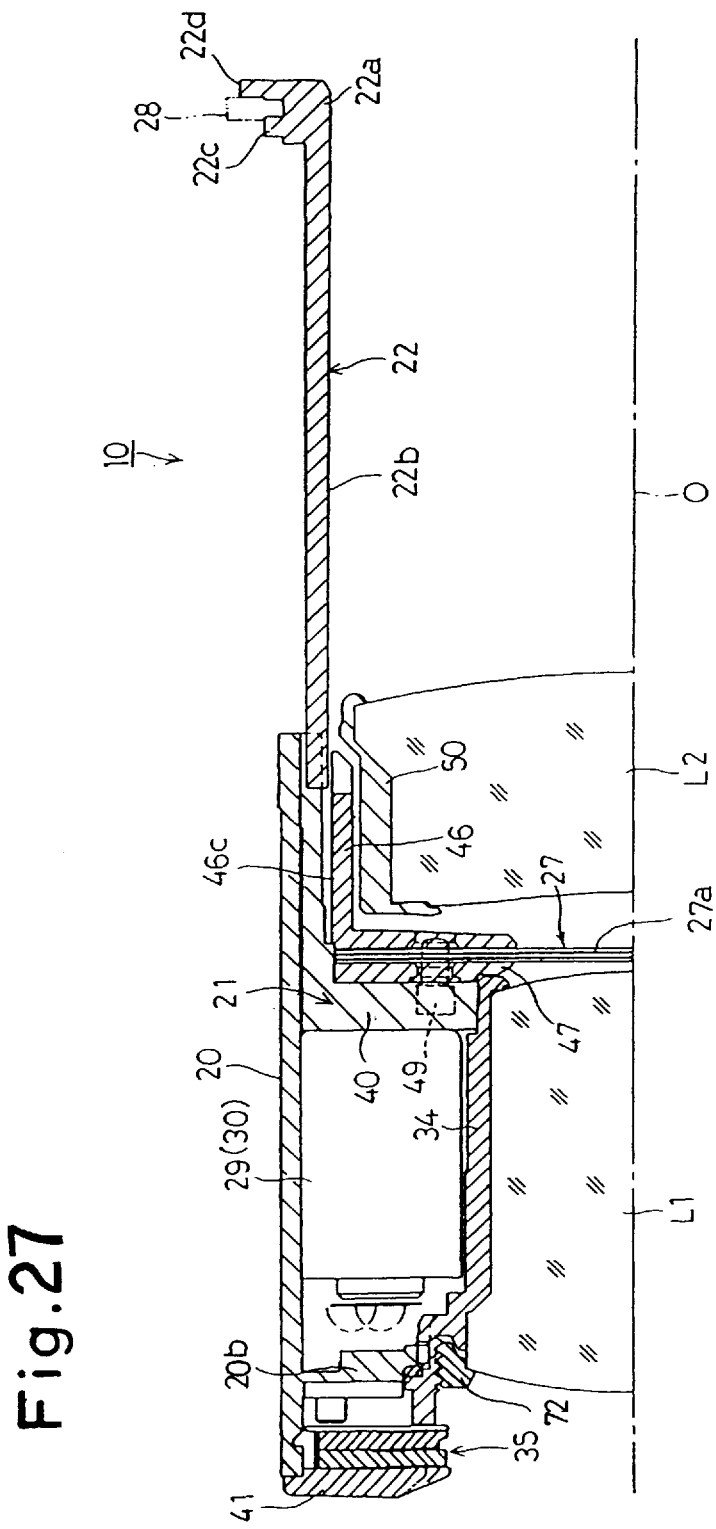
FIG. 27 is a sectional view of the upper part of the zoom lens barrel shown in FIG. 26 in the maximum extended state.
Figure 28:
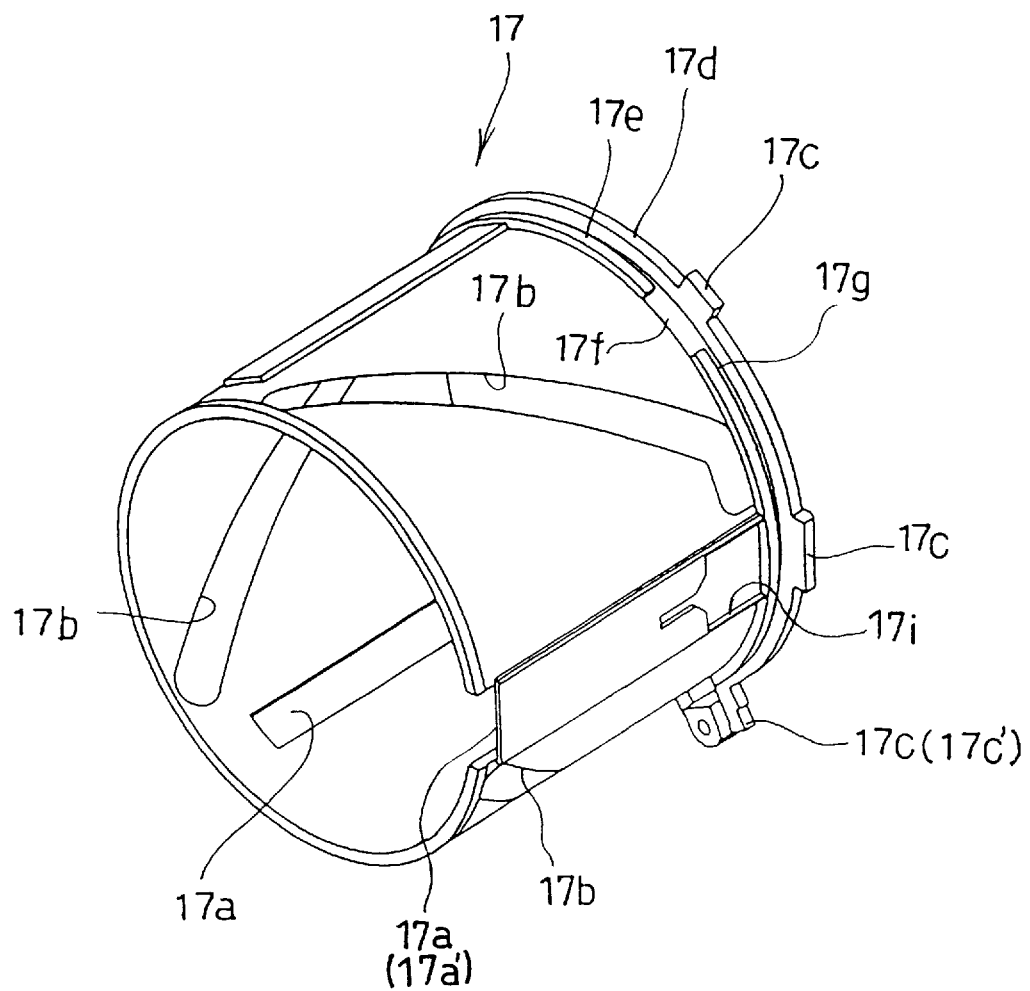
FIG. 28 is an enlarged perspective view of a linear guide barrel shown in FIGS. 3 or 19.

While the zoom lens barrel 10 is driven during the zooming operation, since the rear lens group driving motor 30 is not driven, the front lens group L1 and the rear lens group L2 move as a whole, thus a constant distance is maintained between the lens groups L1 and L2, as shown in FIGS. 1 or 27. The focal length input via the zoom code plate 13a and the contacting terminal 9 is indicated on an LCD panel (not shown) provided on the camera body.

At any focal length set by the zoom operating device 62, when the release button is depressed by a half-step, the object distance measuring apparatus 64 is actuated to measure a current subject distance. At the same time, the photometering apparatus 65 is actuated to measure a present subject brightness. Thereafter, when the release button is fully depressed, the whole optical unit driving motor 25 and the rear lens group driving motor 30 are each driven by respective amounts dictated according to the focal length information set in advance and the subject distance information obtained from the object distance measuring apparatus 64, so that the front and rear lens groups L1 and L2 are respectively moved to specified positions to obtain a specified focal length to thereby bring the subject into focus. Immediately after the subject is brought into focus, via the AE motor controller 66, the AE motor 29 is driven to rotate the circular driving member 49 by an amount corresponding to the subject brightness information obtained from the photometering apparatus 65 so that the shutter 27 is driven to open the shutter blades 27a by a specified amount which satisfies the required exposure. Immediately after such a shutter release operation, in which the three shutter blades 27a are opened and subsequently closed is completed, the whole optical unit driving motor 25 and the rear lens group driving motor 30 are both driven to move the front lens group L1 and the rear lens group L2 to the respective initial positions at which they were at prior to a shutter release.

In the present embodiment of the zoom lens barrel 10, "Fantas Coat SF-6" is used as the coating 72e. However, a different type of coating may be used as the coating 72e as long as it is waterproof and makes the circular abutting surface 72b a smooth surface to form substantially no gap between the circular abutting surface 72b and the circumferential portion fp.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A flexible printed circuit board having a predetermined circuit pattern printed thereon, said flexible printed circuit board being bent at a predetermined position, said flexible printed circuit board comprising:

a covered portion where a part of said printed circuit pattern is covered by a covering layer; and an uncovered portion where another part of said printed circuit pattern is not covered by said covering layer, said covered and uncovered portions being formed on said flexible printed circuit board, wherein a length of a border defining an edge of said covering layer that is located adjacent to said uncovered portion on said flexible printed circuit board positioned proximate to said predetermined bent position is formed to be longer than a minimum length of said border, said minimum length of said boarder being a width of said flexible printed circuit board at said edge of said covering layer.

2. The flexible printed circuit board according to claim 1, wherein said border is formed as a curved border.

3. The flexible printed circuit board according to claim 1, wherein said border is formed as a non-straight border.

4. The flexible printed circuit board according to claim 1, wherein said border is formed as a straight border which extends in a direction oblique to a direction of an apex of said bent portion.

5. The flexible printed circuit board according to claim 1, wherein said another part of said printed circuit pattern comprises a coding pattern with which an electrical brush slidably contacts.

6. The flexible printed circuit board according to claim 1, said flexible printed circuit board being positioned in a zoom lens.

7. A strip-shaped flexible printed circuit board including a predetermined printed circuit pattern, said flexible printed circuit board being bent at a predetermined position, said strip-shaped flexible printed circuit board comprising:

a covered portion where a part of said printed circuit pattern is covered by a covering layer; and an uncovered portion where another part of said printed circuit pattern is not covered by said covering layer, said uncovered portion serving as a coding plate with which an electrical brush slidably contacts, said covered and uncovered portions being formed on said flexible printed circuit board, wherein a border of said covering layer that is located adjacent to said uncovered portion on said flexible printed circuit board is formed as a curved border proximate to said predetermined bent portion, with a center of said curved border being located closer to said predetermined bent portion than either edge of said curved border.

8. The strip-shaped flexible printed circuit board according to claim 7, said flexible printed circuit board being positioned in a zoom lens.

9. A strip-shaped flexible printed circuit board including a predetermined printed circuit pattern, said flexible printed circuit board being bent at a predetermined position, said strip-shaped flexible printed circuit board comprising:

a covered portion where a part of said printed circuit pattern is covered by a covering layer; and an uncovered portion where another part of said printed circuit pattern is not covered by said covering layer, said uncovered portion serving as a coding plate with which an electrical brush slidably contacts, said covered and uncovered portions being formed on said flexible printed circuit board, wherein a border of said covering layer that is located adjacent to said uncovered portion on said flexible printed circuit board is formed non-parallel to said predetermined bent portion.

10. A flexible printed circuit board including a predetermined printed circuit pattern, said flexible printed circuit board being bent at a predetermined position, said flexible printed circuit board comprising:

a covered portion where a part of said printed circuit pattern is covered by a covering layer; and an uncovered portion where another part of said printed circuit pattern is not covered by said covering layer, said uncovered portion serving as a coding plate with which an electrical brush slidably contacts, said covered and uncovered portions being formed on said flexible printed circuit board, wherein a border of said covering layer that is located adjacent to said uncovered portion on said flexible printed circuit board is formed such that a bending stress occurring proximate to said predetermined bent position disperses in a longitudinal direction of said flexible printed circuit board.

* * * * *